United States Patent
Okubo

(10) Patent No.: US 11,967,593 B2
(45) Date of Patent: Apr. 23, 2024

(54) SEMICONDUCTOR DEVICE

(71) Applicant: SOCIONEXT INC., Kanagawa (JP)

(72) Inventor: Kazuya Okubo, Yokohama (JP)

(73) Assignee: SOCIONEXT INC., Kanagawa (JP)

(*) Notice: Subject to any disclaimer, the term of this patent is extended or adjusted under 35 U.S.C. 154(b) by 332 days.

(21) Appl. No.: 17/529,252

(22) Filed: Nov. 17, 2021

(65) Prior Publication Data
US 2022/0077141 A1 Mar. 10, 2022

Related U.S. Application Data

(63) Continuation of application No. PCT/JP2019/020469, filed on May 23, 2019.

(51) Int. Cl.
*H01L 27/02* (2006.01)
*H01L 23/528* (2006.01)
*H01L 23/60* (2006.01)

(52) U.S. Cl.
CPC ...... *H01L 27/0292* (2013.01); *H01L 23/5286* (2013.01); *H01L 23/60* (2013.01)

(58) Field of Classification Search
CPC . H01L 23/5286; H01L 23/60; H01L 27/0251; H01L 27/0255; H01L 27/0259; H01L 27/0266; H01L 27/027; H01L 27/0292
See application file for complete search history.

(56) References Cited

U.S. PATENT DOCUMENTS 9,224,725 B2 12/2015 Usami
9,570,395 B1 2/2017 Sengupta et al.
2001/0035555 A1 11/2001 Nonaka
2003/0174452 A1* 9/2003 Chen ............... H01L 27/0255
361/56
2014/0252476 A1 9/2014 Chang et al.
2017/0294448 A1 10/2017 Debacker et al.
2018/0190670 A1 7/2018 Ryckaert et al.
(Continued)

FOREIGN PATENT DOCUMENTS

JP 2001-284537 A 10/2001
JP 2009-021622 A 1/2009
(Continued)

OTHER PUBLICATIONS

International Search Report issued in corresponding International Application No. PCT/JP2019/020469, dated Jul. 16, 2019, with English translation.
(Continued)

*Primary Examiner* — Brook Kebede
(74) *Attorney, Agent, or Firm* — Rimon P.C.

(57) ABSTRACT

A semiconductor device includes a substrate; a circuit region provided with a power supply wiring, a ground wiring, and a signal line; and a first diode connected between the signal line and a first wiring. The first wiring is one of the power supply wiring and the ground wiring. The first diode includes a first impurity region of a first conductive type, electrically connected to the signal line, and a second impurity region of a second conductive type, different from the first conductive type, electrically connected to the first wiring. The signal line, the first wiring, or both is formed in the substrate.

17 Claims, 31 Drawing Sheets

(56) References Cited

U.S. PATENT DOCUMENTS

| | | | |
|---|---|---|---|
| 2018/0294267 A1 | 10/2018 | Licausi et al. | |
| 2018/0337231 A1* | 11/2018 | Tanaka | H01L 27/0266 |
| 2018/0374791 A1 | 12/2018 | Smith et al. | |
| 2019/0081032 A1 | 3/2019 | Okubo | |

FOREIGN PATENT DOCUMENTS

| | | |
|---|---|---|
| JP | 2009-146977 A | 7/2009 |
| JP | 2012-049444 A | 3/2012 |
| JP | 2015-103605 A | 6/2015 |
| WO | 2017/212644 A1 | 12/2017 |

OTHER PUBLICATIONS

Written Opinion of the International Searching Authority issued in International Application No. PCT/JP2019/020469, dated Jul. 26, 2019, with English translation of the relevant parts.

Chinese Office Action dated Feb. 3, 2024 issued in the corresponding Chinese Patent Application No. 201980096522.7, with English machine translation.

* cited by examiner

SEMICONDUCTOR DEVICE

CROSS-REFERENCE TO RELATED APPLICATION

The present application is a continuation application of International Application No. PCT/JP2019/020469, filed May 23, 2019. The contents of this application are incorporated herein by reference in their entirety.

BACKGROUND OF THE INVENTION

1. Field of the Invention

The present disclosure relates to semiconductor devices.

2. Description of the Related Art

Semiconductor devices include various circuit regions. Circuit regions include, for example, internal circuit regions and input/output (I/O) cell regions. The I/O cell region may be provided with an ESD (Electro-Static Discharge) protection circuit to suppress breakdown of the internal circuit region due to static electricity. Power supply wirings are provided in the various circuit regions.

The power supply wirings are mainly provided above substrates. Recently, semiconductor devices in which power supply wirings are buried in the substrates have been proposed. The power supply wiring having such a structure is sometimes referred to as a BPR (Buried Power Rail). (See, for example, U.S. Pat. No. 9,224,725, U.S. Patent Application Publication No. 2018/0374791, U.S. Patent Application Publication No. 2018/0190670, U.S. Patent Application Publication No. 2018/0294267, U.S. Patent Application Publication No. 2017/0294448, or U.S. Pat. No. 9,570,395).

SUMMARY OF INVENTION

Problem to be Solved by the Invention

Configurations of semiconductor devices including the ESD protection circuits using buried wirings such as BPR have not been specifically studied in detail yet.

It is an object of the present invention to provide a semiconductor device capable of implementing an ESD protection circuit including a buried wiring.

Means for Solving Problems

According to an aspect of the present disclosure, a semiconductor device includes a substrate; a circuit region provided with a power supply wiring, a ground wiring, and a signal line; and a first diode connected between the signal line and a first wiring. The first wiring is one of the power supply wiring and the ground wiring. The first diode has a first impurity region of a first conductive type, electrically connected to the signal line, and a second impurity region of a second conductive type, different from the first conductive type, electrically connected to the first wiring. The signal line, the first wiring, or both is formed in the substrate.

Effects of the Invention

According to the disclosure of the present application, an ESD protection circuit including a buried wiring can be implemented.

BRIEF DESCRIPTION OF DRAWINGS

Other objects and further features of the present disclosure will be apparent from the following detailed description when read in conjunction with the accompanying drawings, in which.

MODE FOR CARRYING OUT THE INVENTION

Figure 1:
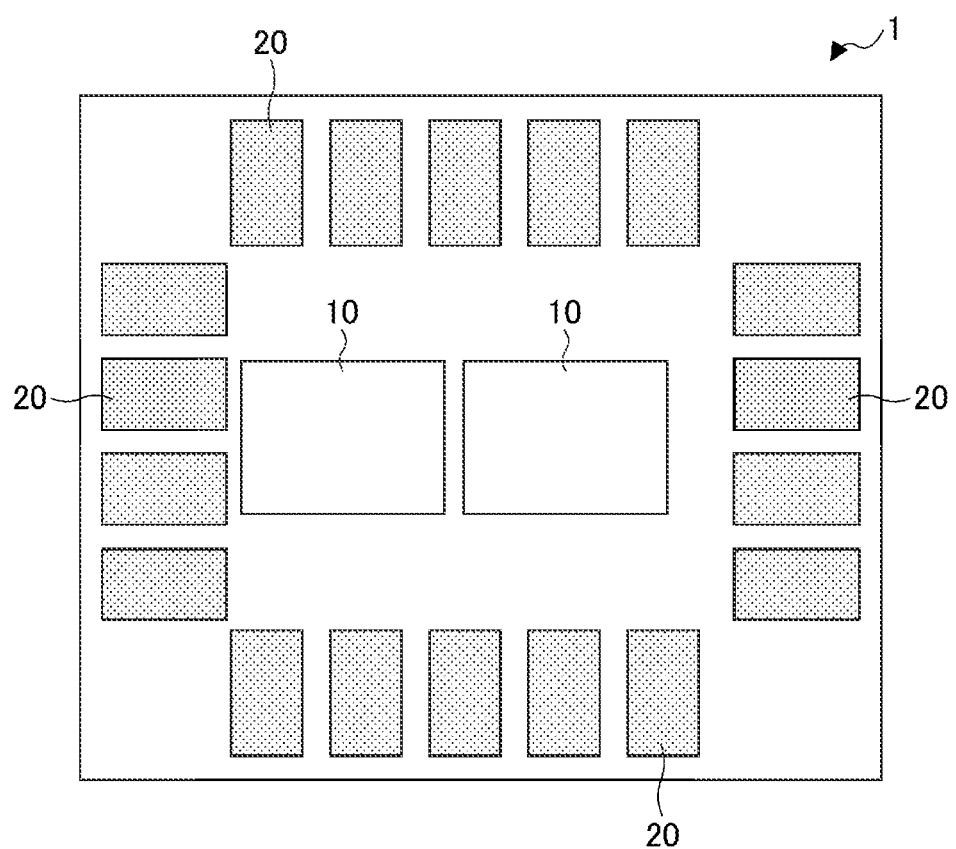
FIG. 1 is a diagram depicting an example of a layout of a semiconductor device according to a first embodiment.

In the following, embodiments will be described in detail with reference to the accompanying drawings. In the present specification and the drawings, components having substantially the same functional structure are assigned the same reference numeral, and overlapping descriptions may be omitted. In the following description, two directions parallel to a surface of the substrate and orthogonal to each other are defined to be an X-direction and a Y-direction, and a direction orthogonal to the surface of the substrate is defined to be a Z-direction. Moreover, alignment of arrangement in the present disclosure does not strictly mean that any inconsistency due to manufacturing variation is excluded, and even if the arrangement is misaligned due to the manufacturing variation, the arrangement can be regarded as aligned.

First Embodiment

Figure 2:
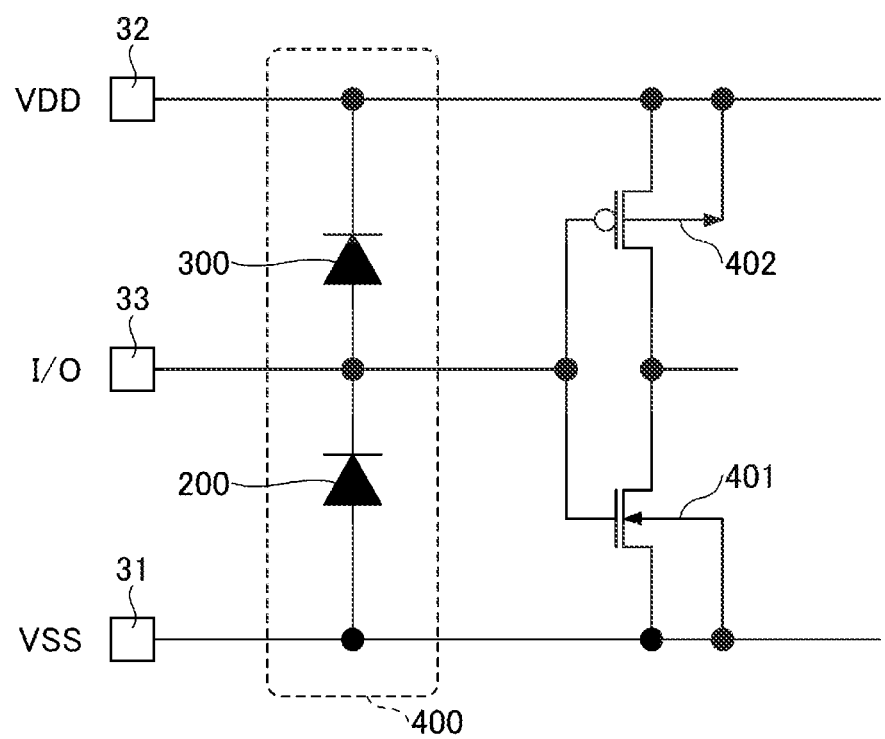
FIG. 2 is a circuit diagram depicting an example of a configuration of an input/output (I/O) cell region included in the semiconductor device according to the first embodiment.

A first embodiment will be described. FIG. 1 is a diagram illustrating a layout of a semiconductor device according to the first embodiment. FIG. 2 is a circuit diagram illustrating a configuration of an I/O cell region included in the semiconductor device according to the first embodiment.

As shown in FIG. 1, the semiconductor device 1 according to the first embodiment includes a plurality of internal circuit regions 10 and an input/output (I/O) cell region 20 arranged around the internal circuit regions 10. It should be noted that the number of the internal circuit regions 10 arranged on the semiconductor device 1 may be 1, or may be 3 or more.

As shown in FIG. 2, the I/O cell region 20 includes a VSS pad 31, a VDD pad 32, and an I/O pad 33. To the VSS pad 31 a VSS wiring that supplies a VSS power supply potential to the internal circuit region 10 is connected. The VSS power supply potential is, for example, a ground potential. To the VDD pad 32 a VDD wiring that supplies the VDD power supply potential to the internal circuit region 10 is connected. A signal line in the internal circuit region 10 is connected to the I/O pad 33. The I/O cell region 20 has an inverter that includes, for example, an N-channel MOS transistor 401 and a P-channel MOS transistor 402. For example, a gate of the N-channel MOS transistor 401 and a gate of the P-channel MOS transistor 402 are connected to the I/O pad 33. For example, a source of the N-channel MOS transistor 401 is connected to the VSS pad 31, and a source of the P-channel MOS transistor 402 is connected to the VDD pad 32. The VSS wiring is sometimes referred to as a ground wiring, and the VDD wiring is sometimes referred to as a power supply wiring.

As shown in FIG. 2, the I/O cell region 20 includes an ESD protection circuit 400 that includes a diode 200 and a diode 300. An anode of the diode 200 is connected to the VSS pad 31 and a cathode of the diode 200 is connected to the I/O pad 33. An anode of the diode 300 is connected to the I/O pad 33 and a cathode of the diode 300 is connected to the VDD pad 32.

Figure 3:
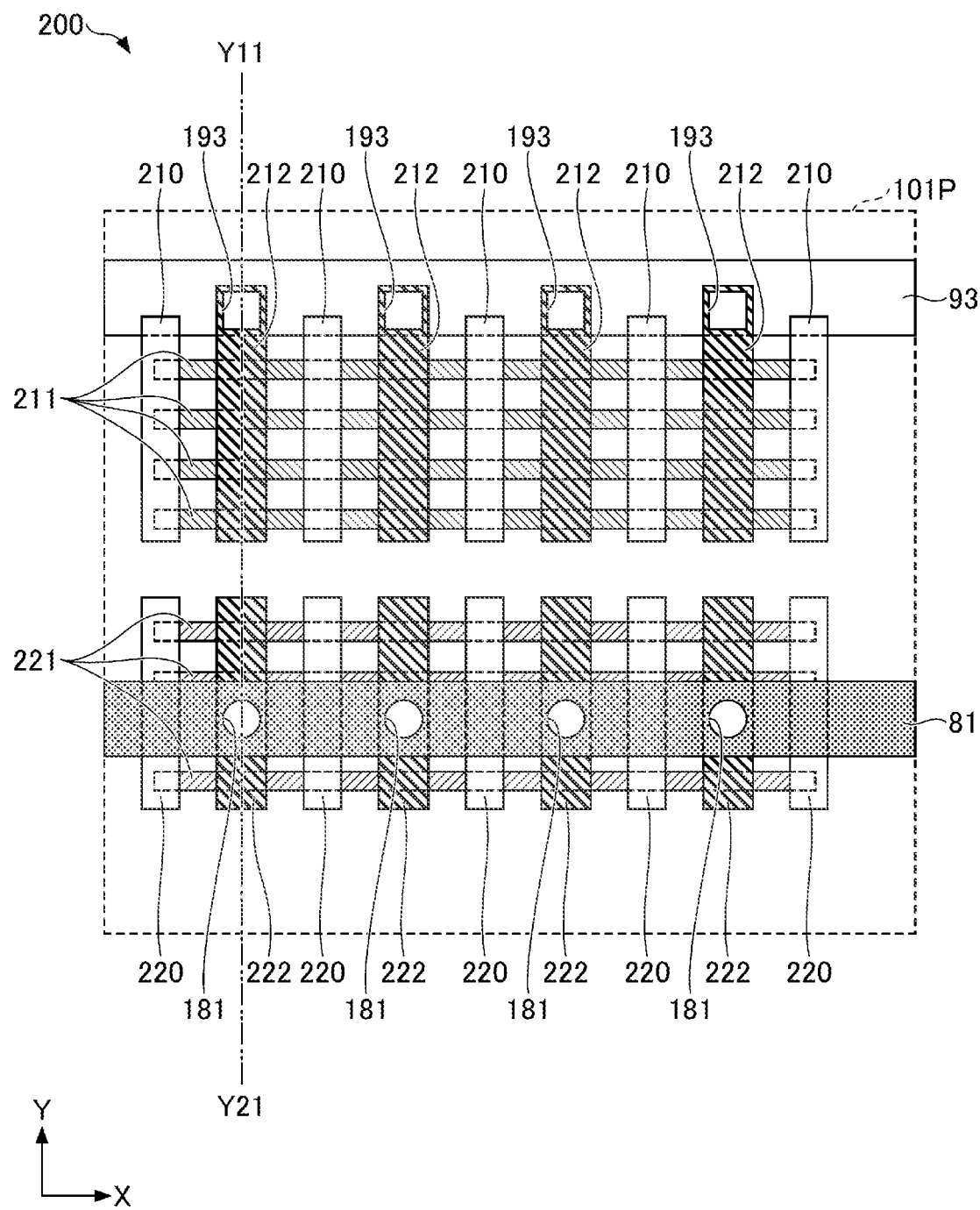
FIG. 3 is a diagram schematically depicting a planar configuration of one diode according to the first embodiment.
Figure 4:
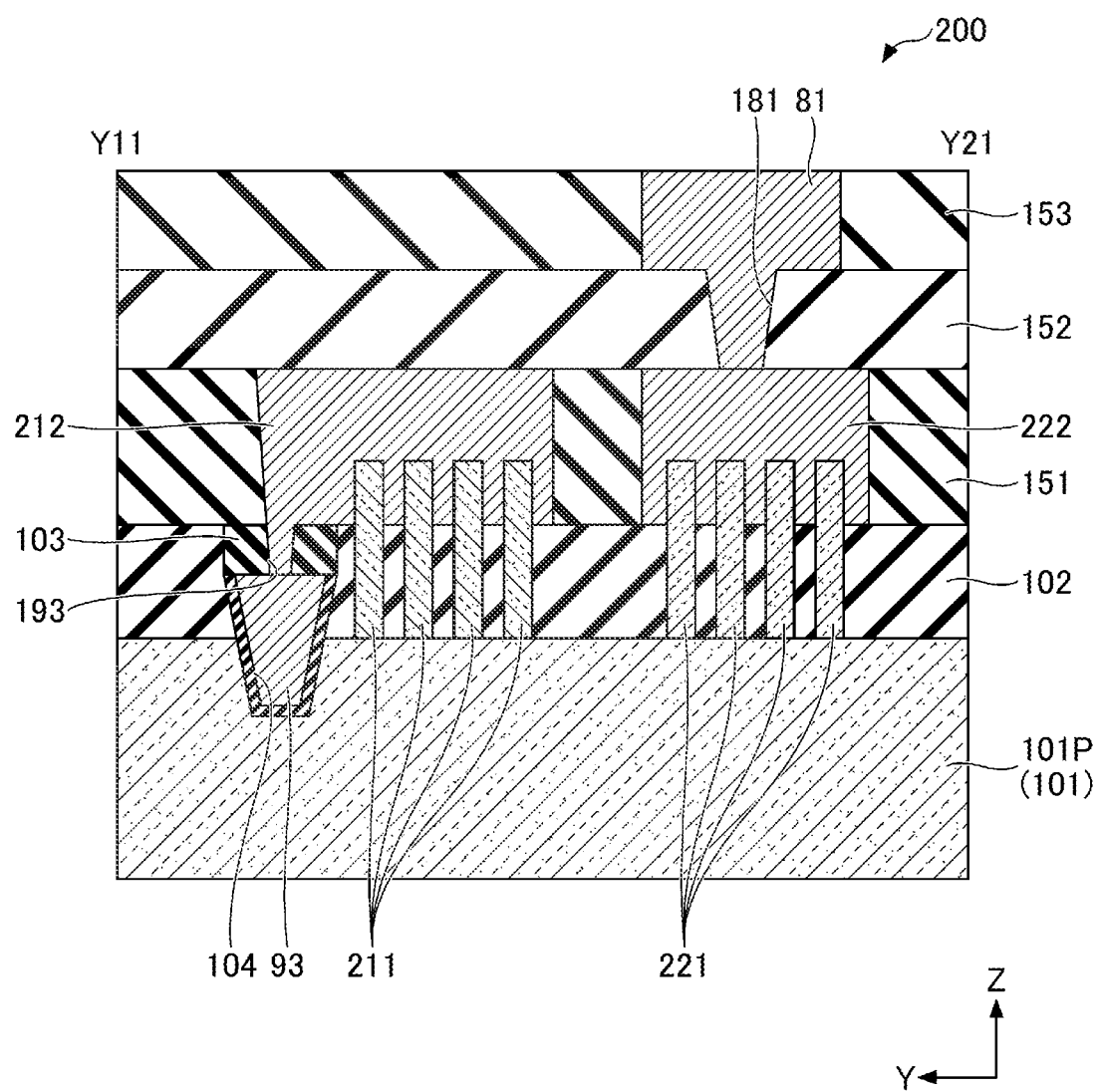
FIG. 4 is a cross-sectional view illustrating the one diode according to the first embodiment.

Next, the configuration of the diode 200 will be described. FIG. 3 is a schematic diagram illustrating a planar configuration of the diode 200 according to the first embodiment. FIG. 4 is a cross-sectional view illustrating the diode 200 according to the first embodiment. FIG. 4 is a diagram depicting a cross section cut along a line Y11-Y21 in FIG. 3.

As shown in FIGS. 3 and 4, a P-well 101P is formed in the surface of the substrate 101, and an element separation film 102 is formed on the surface of the P-well 101P. The element separation film 102 is formed, for example, by using a Shallow Trench Isolation (STI) method. In the P-well 101P and the element separation film 102, a groove extending in the X-direction is formed, and in the groove a signal line 93 is formed via an insulation film 104. For example, the surface of the signal line 93 is covered by the insulation film 103. For example, the surface of the element separation film 102 and the surface of the insulation film 103 may be flush with or may not be flush with the surface of the P-well 101P. For example, the signal line 93 is connected to the I/O pad 33. The conductive type of the substrate 101 may be a P-type. In this case, the P-well 101P can be read as a P-type substrate 101P. The same applies to other embodiments and variations.

A plurality of N-type fins 211 and a plurality of P-type fins 221 extending in the X-direction and standing in the Z-direction are formed on the P-well 101P exposed from the element separation film 102. In the embodiment, four N-type fins 211 and four P-type fins 221 are formed. For example, in the Y-direction, the N-type fin 211 is located between the signal line 93 and the P-type fin 221. The P-type fin 221 serves as an anode of the diode 200 and the N-type fin 211 serves as a cathode of the diode 200.

A plurality of local wirings 212 extending in the Y-direction and connected to the N-type fins 211 are formed on the element separation film 102. In the embodiment, four local wirings 212 are formed. A plurality of dummy-gate electrodes 210, such as gate electrodes of so-called fin transistors, are formed in the X-direction so as to arrange the local wiring 212 between an adjacent pair of the dummy-gate electrodes 210. The dummy-gate electrode 210 extends in the Y-direction. A dummy-gate insulation film (not shown) is formed between the dummy-gate electrode 210 and the N-type fin 211.

A plurality of local wirings 222 extending in the Y-direction and connected to the P-type fins 221 are formed on the element separation film 102. In the embodiment, four local wirings 222 are formed. A plurality of dummy-gate electrodes 220, such as gate electrodes of so-called fin transistors, are formed in the X-direction so as to arrange the local wiring 222 between the adjacent pair of the dummy-gate electrodes 220. The dummy-gate electrode 220 extends in the Y-direction. A dummy-gate insulation film (not shown) is formed between the dummy-gate electrode 220 and the P-type fin 221.

As shown in FIG. 4, an insulation film 151 is formed above the P-well 101P and the element separation film 102. The local wirings 212 and 222 and the dummy-gate electrodes 210 and 220 are buried in the insulation film 151. An insulation film 152 is formed over the insulation film 151, and the local wirings 212 and 222, and above the dummy-gate electrodes 210 and 220, and an insulation film 153 is formed over the insulation film 152.

A contact hole 193 is formed in the insulation film 103 between the local wiring 212 and the signal line 93, and the local wiring 212 is connected to the signal line 93 via a conductor in the contact hole 193.

In the insulation film 152, a contact hole 181 reaching the local wiring 222 is formed. In the insulation film 153, a power supply wiring 81 is formed which extends in the X-direction and is connected to the local wiring 222 through a conductor in the contact hole 181. For example, the power supply wiring 81 is connected to the VSS pad 31.

Figure 5:
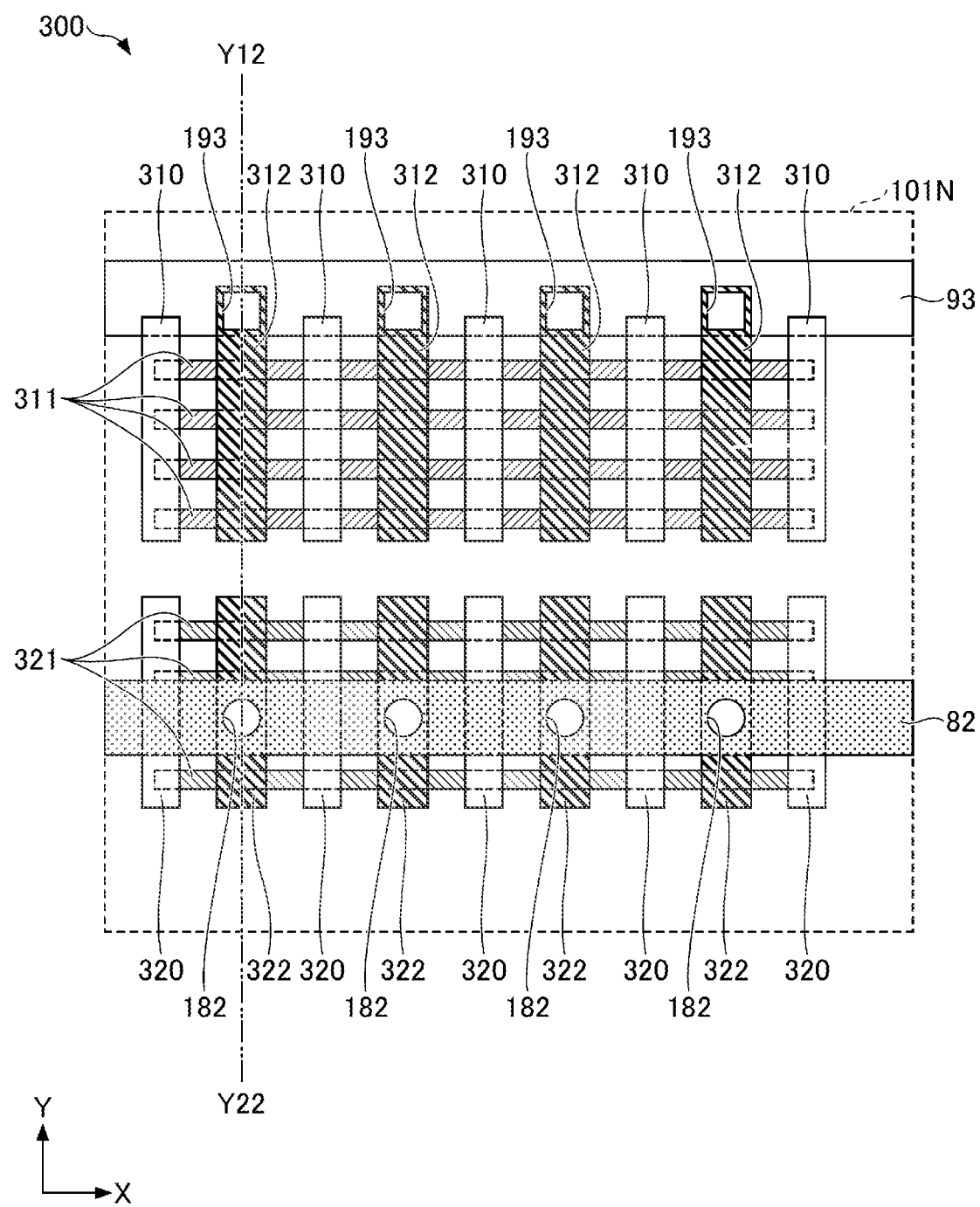
FIG. 5 is a diagram schematically depicting a planar configuration of another diode according to the first embodiment.
Figure 6:
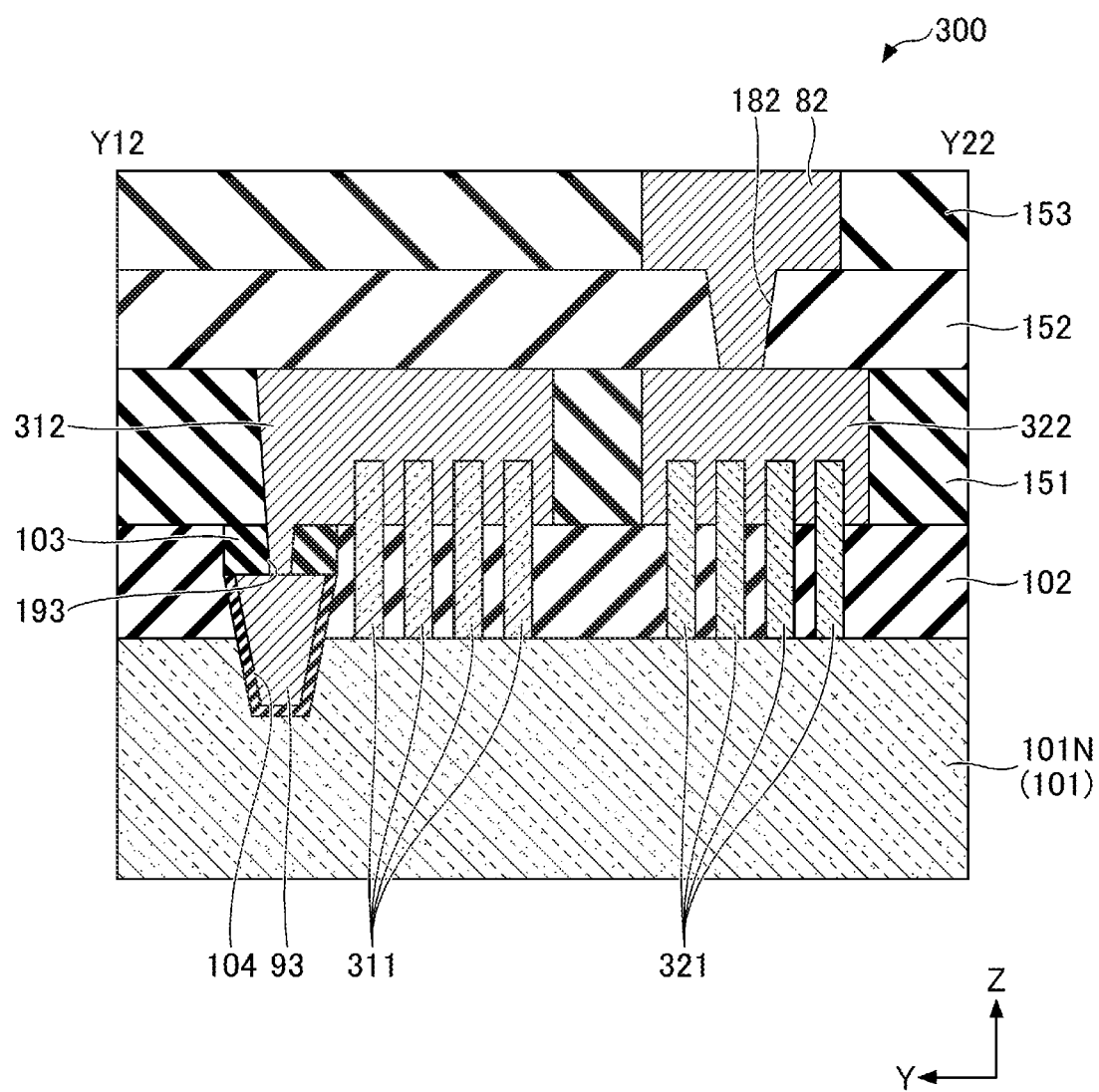
FIG. 6 is a cross-sectional view illustrating the other diode according to the first embodiment.

Next, the configuration of the diode 300 will be described. FIG. 5 is a schematic diagram showing a planar configuration of the diode 300 according to the first embodiment. FIG. 6 is a cross-sectional view illustrating the diode 300 according to the first embodiment. FIG. 6 is a diagram depicting a cross section cut along a line Y12-Y22 in FIG. 5.

As shown in FIGS. 5 and 6, an N-well 101N is formed in the surface of the substrate 101, and an element separation film 102 is formed on the surface of the N-well 101N. In the N-well 101N and the element separation film 102, a groove extending in the X-direction is formed, and in the groove a signal line 93 is formed via an insulation film 104. For example, the surface of the signal line 93 is covered by the insulation film 103. For example, the surface of the element separation film 102 and the surface of the insulation film 103 may be flush with or may not be flush with the surface of the N-well 101N.

A plurality of P-type fins 311 and a plurality of N-type fins 321 extending in the X-direction and standing in the Z-direction are formed on the N-well 101N exposed from the element separation film 102. In the embodiment, four P-type fins 311 and four N-type fins 321 are formed. For example, in the Y-direction, the P-type fin 311 is located between the signal line 93 and the N-type fin 321. The P-type fin 311 serves as an anode of the diode 300 and the N-type fin 321 serves as a cathode of the diode 300.

A plurality of local wirings 312 extending in the Y-direction and connected to the P-type fins 311 are formed on the element separation film 102. In the embodiment, four local wirings 312 are formed. A plurality of dummy-gate electrodes 310, such as gate electrodes of so-called fin-transistors, are formed in the X-direction so as to arrange the local wiring 312 between the adjacent pair of the dummy-gate electrodes 310. The dummy-gate electrode 310 extends in the Y-direction. A dummy-gate insulation film (not shown) is formed between the dummy-gate electrode 310 and the P-type fin 311.

A plurality of local wirings 322 extending in the Y-direction and connected to the N-type fins 321 are formed on the element separation film 102. In the embodiment, four local wirings 322 are formed. A plurality of dummy-gate electrodes 320, such as gate electrodes of so-called fin transistors, are formed in the X-direction so as to arrange the local wiring 322 between the adjacent pair of the dummy-gate electrodes 320. The dummy-gate electrode 320 extends in the Y-direction. A dummy-gate insulation film (not shown) is formed between the dummy-gate electrode 320 and the N-type fin 321.

As shown in FIG. 6, an insulation film 151 is formed above the N-well 101N and the element separation film 102. The local wiring 312 and 322 and the dummy-gate electrodes 310 and 320 are buried in the insulation film 151. The insulation film 152 is formed over the insulation film 151, and the local wirings 312 and 322, and above the dummy-gate electrodes 310 and 320, and the insulation film 153 is formed over the insulation film 152.

The contact hole 193 is formed in the insulation film 103 between the local wiring 312 and the signal line 93, and the local wiring 312 is connected to the signal line 93 through a conductor in the contact hole 193.

In the insulation film 152, a contact hole 182 reaching the local wiring 322 is formed. In the insulation film 153, a power supply wiring 82 is formed which extends in the X-direction and is connected to the local wiring 322 through a conductor in the contact hole 182. For example, the power supply wiring 82 is connected to the VDD pad 32.

In the first embodiment, the diode 200 includes the signal line 93 as a buried wiring, and the diode 300 includes the signal line 93 as a buried wiring. Thus, according to the first embodiment, an ESD protection circuit including buried wirings can be implemented. Therefore, the configuration of the wirings according to the first embodiment is suitable for miniaturization of semiconductor devices.

In addition, in the diode 200, instead of the power supply wiring 81, a power supply wiring connected to the local wiring 222 may be formed in the P-well 101P as the buried wiring. Similarly, in the diode 300, instead of the power supply wiring 82, a power supply wiring connected to the local wiring 322 may be formed in the N-well 101N as the buried wiring. In addition, in the diodes 200 and 300, instead of the signal line 93, a signal line connected to the local wiring 212 and a signal line connected to the local wiring 312 may be formed in the insulation film 153, respectively. Furthermore, the number of the fins, the dummy-gate electrodes, and the local wirings in the diodes 200 and 300 may be changed accordingly.

Second Embodiment

Figure 7:
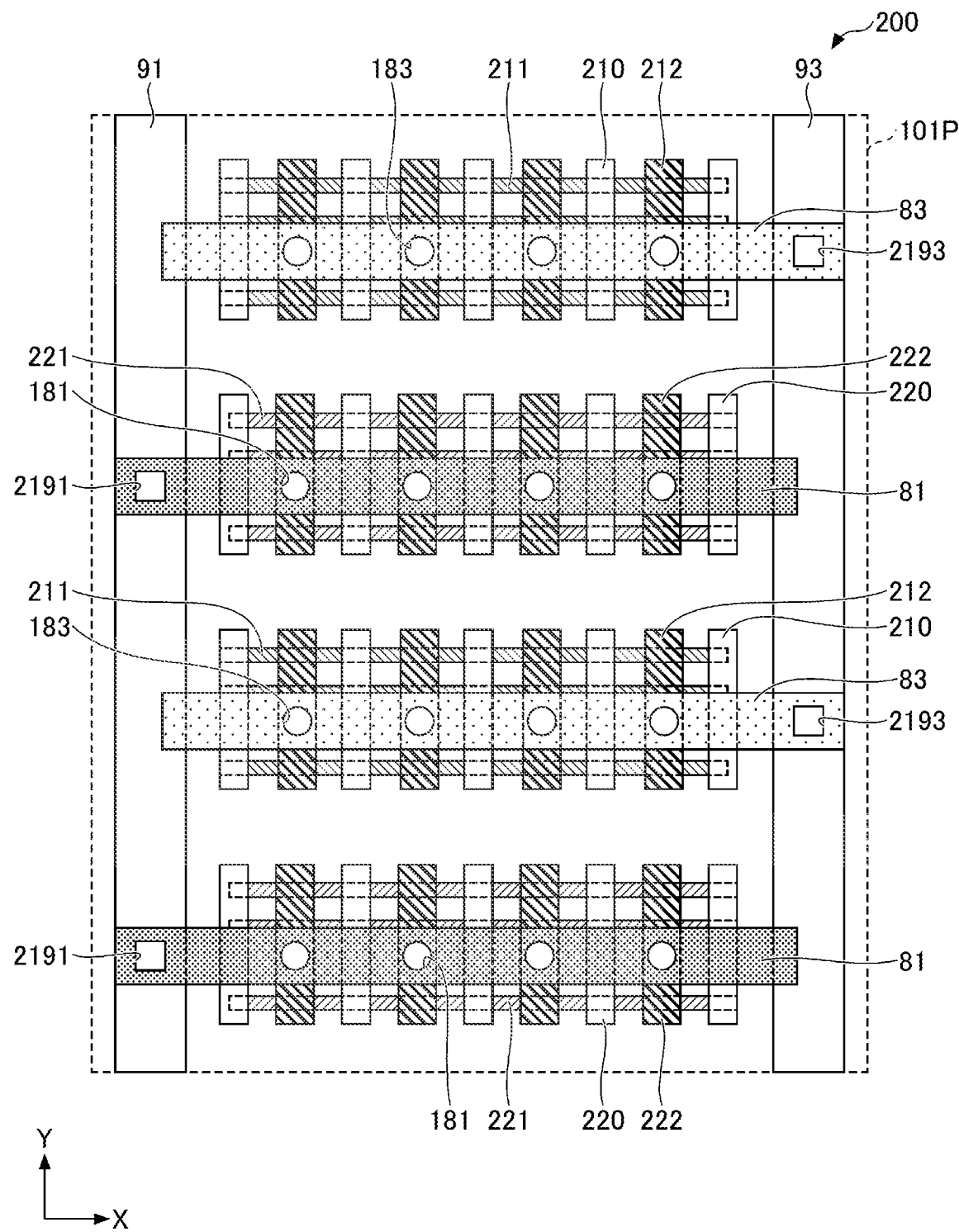
FIG. 7 is a diagram schematically depicting a planar configuration of one diode according to a second embodiment.
Figure 8:
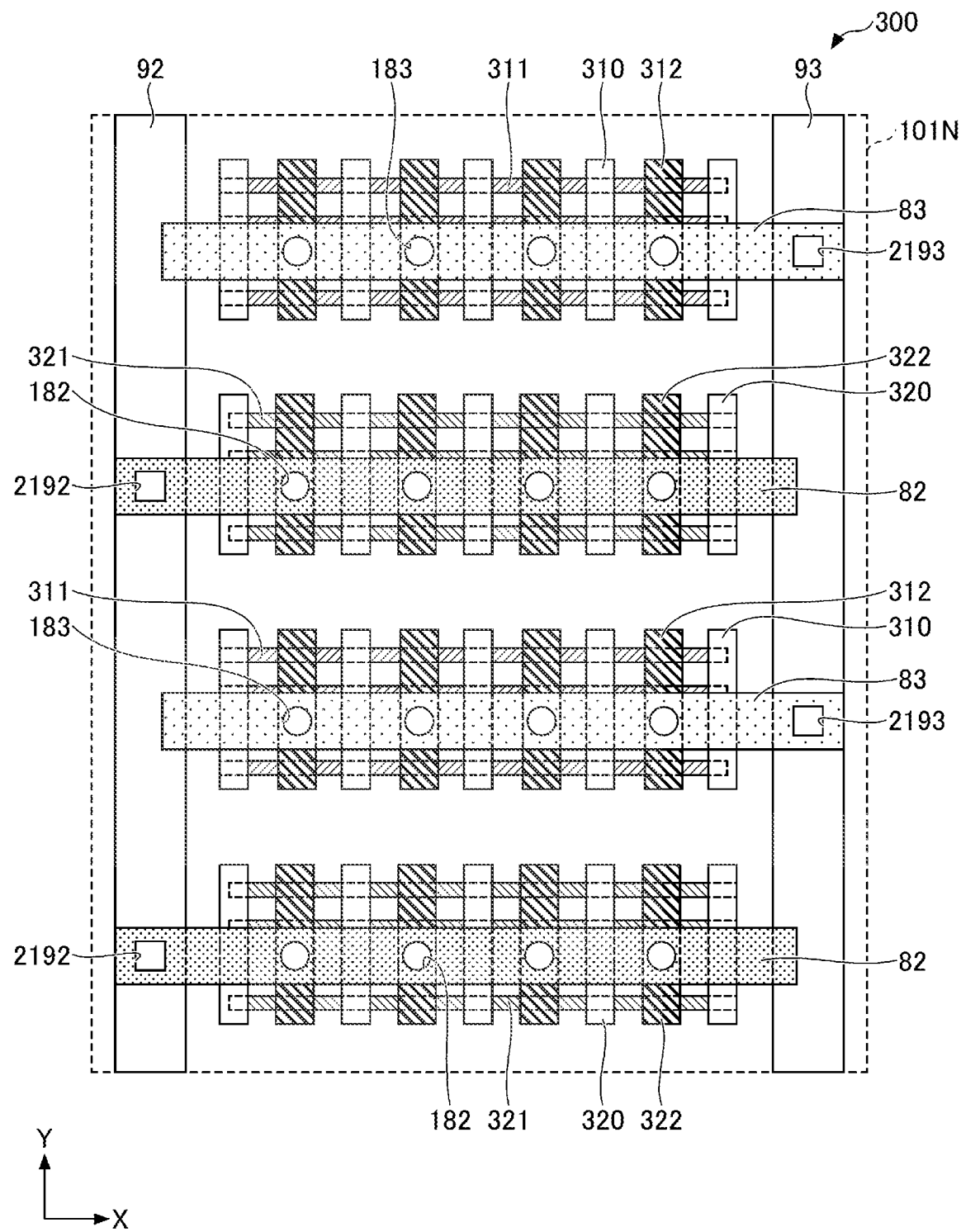
FIG. 8 is a diagram schematically depicting a planar configuration of another diode according to the second embodiment.

Next, a second embodiment will be described. The second embodiment differs primarily from the first embodiment in the extending direction of the signal line and power supply wiring. FIG. 7 is a schematic diagram showing a planar configuration of the diode 200 according to the second embodiment. FIG. 8 is a schematic diagram showing a planar configuration of the diode 300 according to the second embodiment.

As shown in FIG. 7, in the diode 200, a groove extending in the Y-direction is formed in the P-well 101P and the element separation film 102 and in this groove a signal line 93 is formed via an insulation film 104 (see FIG. 4). In the insulation film 152 (see FIG. 4), a contact hole 183 reaching the local wiring 212 is formed. A signal line 83 is formed in the insulation film 153 that extends in the X-direction and is connected to the local wiring 212 through a conductor in the contact hole 183. A contact hole 2193 is formed between the signal line 83 and the signal line 93 in the insulation films 152 and 151 (see FIG. 4), and the signal line 83 is connected to the signal line 93 through a conductor in the contact hole 2193.

Moreover, in the diode 200, another groove extending in the Y-direction is formed in the P-well 101P and the element separation film 102, and in this groove a power supply wiring 91 is formed via an insulation film 104 (see FIG. 4). In the insulation film 152 (see FIG. 4), a contact hole 181 reaching the local wiring 222 is formed. A power supply wiring 81 is formed in the insulation film 153 (see FIG. 4) extending in the X-direction and connected to the local wiring 222 through a conductor in the contact hole 181. A contact hole 2191 is formed in the insulation films 152 and 151 (see FIG. 4) between the power supply wiring 81 and the power supply wiring 91. The power supply wiring 81 is connected to the power supply wiring 91 through a conductor in the contact hole 2191. At the position where the contact hole 2191 is formed, a local wiring, and a contact hole that connects the local wiring to the power supply wiring 81 or the power supply wiring 91 may be formed.

In the second embodiment, the diode 200 includes two sets each including four N-type fins 211, four local wirings 212, four contact holes 183, five dummy-gate electrodes 210, and one signal line 83. Moreover, the diode 200 includes two sets each including four P-type fins 221, four local wirings 222, four contact holes 181, five dummy-gate electrodes 220, and one power supply wiring 81.

As shown in FIG. 8, in the diode 300, a groove extending in the Y-direction is formed in the N-well 101N and the element separation film 102 and in this groove a signal line 93 is formed via an insulation film 104 (see FIG. 4). In the insulation film 152 (see FIG. 4), a contact hole 183 reaching the local wiring 312 is formed. A signal line 83 is formed in the insulation film 153 that extends in the X-direction and is connected to the local wiring 312 through a conductor in the contact hole 183. A contact hole 2193 is formed between the signal line 83 and the signal line 93 in the insulation films 152 and 151 (see FIG. 4), and the signal line 83 is connected to the signal line 93 through a conductor in the contact hole 2193. At the position where the contact hole 2193 is formed, a local wiring, and a contact hole that connects the local wiring to the signal line 83 or the signal line 93 may be formed.

Moreover, in the diode 300, another groove extending in the Y-direction is formed in the N-well 101N and the element separation film 102, and in this groove a power supply wiring 92 is formed via an insulation film 104 (see FIG. 4). In the insulation film 152 (see FIG. 4), a contact hole 182 reaching the local wiring 322 is formed. A power supply wiring 82 is formed in the insulation film 153 (see FIG. 4) extending in the X-direction and connected to the local wiring 322 through a conductor in the contact hole 182. A contact hole 2192 is formed in the insulation films 152 and 151 (see FIG. 4) between the power supply wiring 82 and the power supply wiring 92. The power supply wiring 82 is connected to the power supply wiring 92 through a conductor in the contact hole 2192. At the position where the contact hole 2192 is formed, a local wiring, and a contact hole that connects the local wiring to the power supply wiring 92 or the power supply wiring 82 may be formed.

In the second embodiment, the diode 300 includes two sets each including four P-type fins 311, four local wirings 312, four contact holes 183, five dummy-gate electrodes 310, and one signal line 83. Moreover, the diode 300 includes two sets each including four N-type fins 321, four local wirings 322, four contact holes 182, five dummy-gate electrodes 320, and one power supply wiring 82.

Other configurations of the semiconductor device according to the second embodiment are the same as those of the first embodiment.

In the second embodiment, the diode 200 includes the power supply wiring 91 and the signal line 93 as buried wirings, and the diode 300 includes the power supply wiring 92 and the signal line 93 as buried wirings. Thus, according to the second embodiment, an ESD protection circuit including buried wirings can be implemented. Therefore, the configuration of the wirings according to the second embodiment is suitable for further miniaturization of semiconductor devices.

Furthermore, the power supply wiring 91 extending in the Y-direction and the plurality of power supply wirings 81 extending in the X-direction configure a power supply network. Moreover, the power supply wiring 92 extending in the Y-direction and the plurality of power supply wirings 82 extending in the X-direction configure another power supply network. Furthermore, the signal line 93 extending in the Y-direction and the plurality of signal lines 83 extending in the X-direction configure yet another power supply network. Thus, a current flowing through each of the diodes can be made more uniform. Moreover, compared with the case where the power supply wiring or the signal line configuring the power supply network is formed only above the fins, the uniformity of the current can be improved.

Moreover, at least a portion of the power supply wiring or the signal line extending in the Y-direction and at least a portion of the power supply wiring or the signal line extending in the X-direction may be formed in the substrate 101, to the extent that wirings of different potentials or different signals are not connected to each other. Furthermore, in the diodes 200 and 300, the number of the fins, the dummy-gate electrodes, the local wirings, and sets provided in each diode may be changed accordingly. The above-described numbers may be changed also in the other embodiments and variations in the same manner as above.

In the other embodiments and variations, the power supply wiring or the signal line may be formed in the substrate 101 so that at least a portion of the wiring or the line extends in the Y-direction.

Third Embodiment

Figure 9:
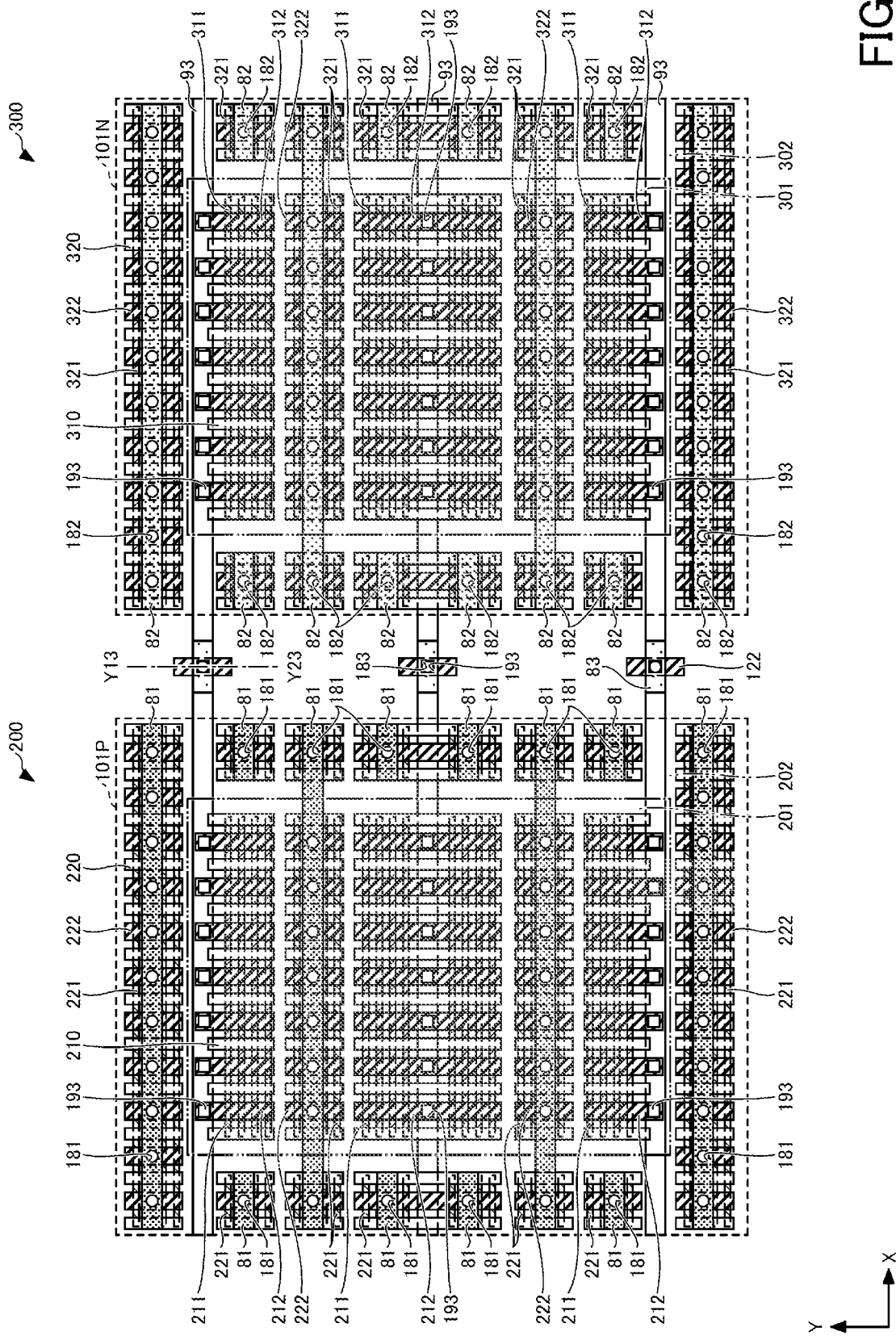
FIG. 9 is a diagram schematically depicting a planar configuration of two diodes according to a third embodiment.
Figure 10:
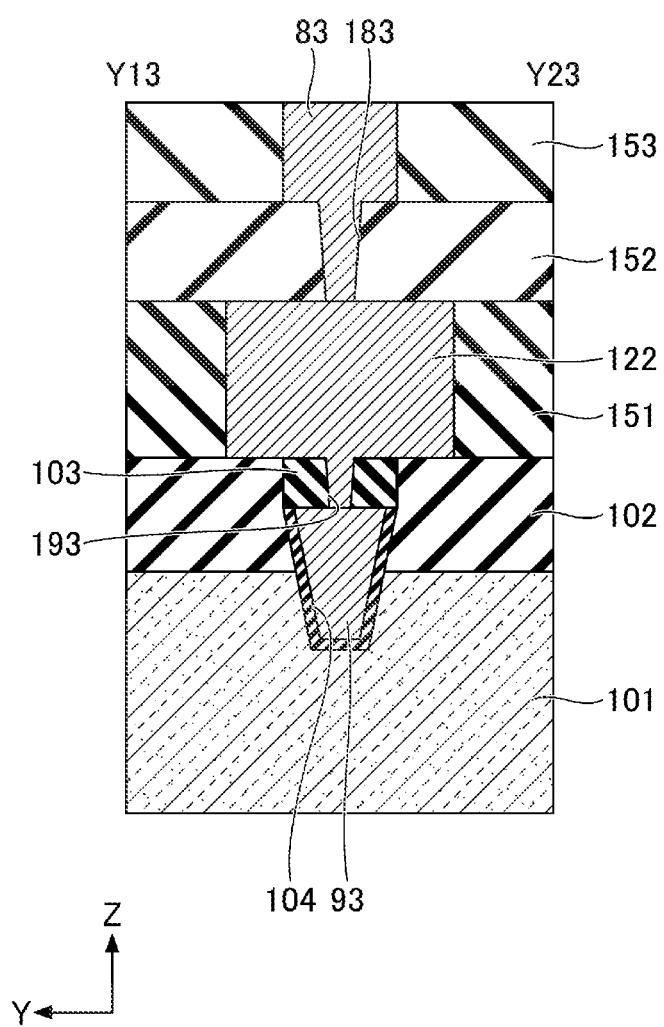
FIG. 10 is a cross-sectional view illustrating an intermediate portion connecting the two diodes according to the third embodiment.

Next, a third embodiment will be described. The third embodiment mainly differs from the first embodiment in the size of the diodes. FIG. 9 is a schematic diagram showing a planar configuration of the diodes 200 and 300 according to the third embodiment. FIG. 10 is a cross-sectional view illustrating an intermediate portion connecting the diode 200 and the diode 300 according to the third embodiment. FIG. 10 is a diagram depicting a cross section cut along a line Y13-Y23 in FIG. 9.

As shown in FIG. 9, in the third embodiment, the diode 200 and the diode 300 are arranged along the X-direction. The plurality of signal lines, in the present embodiment, three signal lines 93 are commonly provided on the diode 200 and the diode 300. As shown in FIG. 10, a contact hole 193 reaching the signal line 93 is formed in the insulation film 103 between the diode 200 and the diode 300. A local wiring 122 connected to the signal line 93 through a conductor in the contact hole 193 is formed on the element separation film 102. In the insulation film 152, a contact hole 183 reaching the local wiring 122 is formed. In the insulation film 153, a signal line 83, extending in the X-direction and connected to the local wiring 122 through a conductor in the contact hole 183, is formed.

The diode 200 includes a main portion 201 and a guard ring portion 202 that surrounds the main portion 201 in a plan view.

In the main portion 201, four N-type fins 211, four P-type fins 221, and four N-type fins 211 are provided in this order between two signal lines 83 adjacent in the Y-direction. Three signal lines 83 are provided as described above. Accordingly, the main portion 201 has two sets each including four N-type fins 211, four P-type fins 221, and four N-type fins 211. In the same manner as in the first embodiment, the local wirings 212 and 222, the dummy-gate electrodes 210 and 220, the contact holes 193 and 181, and the power supply wiring 81 are provided in the main portion 201.

In the guard ring portion 202, the plurality of P-type fins 221 are arranged annularly. The guard ring portion 202 also includes a local wiring 222 connected to the P-type fin 221 and a power supply wiring 81 connected to the local wiring 222. A portion of the power supply wiring 81 in the guard ring portion 202 may be common to a portion of the power supply wiring 81 in the main portion 201.

The diode 300 has a main portion 301 and a guard ring portion 302 that surrounds the main portion 301 in a plan view.

In the main portion 301, four P-type fins 311, four N-type fins 321, and four P-type fins 311 are provided in this order between two signal lines 83 adjacent in the Y-direction. Three signal lines 83 are provided as described above. Accordingly, the main portion 301 has two sets each including four P-type fins 311, four N-type fins 321, and four P-type fins 311. In the same manner as in the first embodiment, the local wirings 312 and 322, the dummy-gate electrodes 310 and 320, the contact holes 193 and 182, and the power supply wiring 82 are provided in the main portion 301.

In the guard ring portion 302, the plurality of N-type fins 321 are arranged annularly. The guard ring portion 302 also includes a local wiring 322 connected to the N-type fin 321 and a power supply wiring 82 connected to the local wiring 322. A portion of the power supply wiring 82 in the guard ring portion 302 may be common to a portion of the power supply wiring 82 in the main portion 301.

In the third embodiment, for example, the signal line 83 connected to the local wiring 122 is connected to the I/O pad 33. Then, the diodes 200 and 300 are provided with a common signal line 93 electrically connected to the signal line 83 as buried wirings. Thus, according to the third embodiment, an ESD protection circuit including buried wiring can be implemented. Moreover, since the diode 200 includes the guard ring portion 202 and the diode 300 includes the guard ring portion 302, it is possible to suppress leakage of current from the main portions 201 and 301 to the outside. The power supply wiring connected to the VSS pad 31 or the power supply wiring connected to the VDD pad 32 may be buried. Moreover, both the power supply wiring connected to the VSS pad 31 and the power supply wiring connected to the VDD pad 32 may be buried.

First Variation of the Third Embodiment

Figure 11:
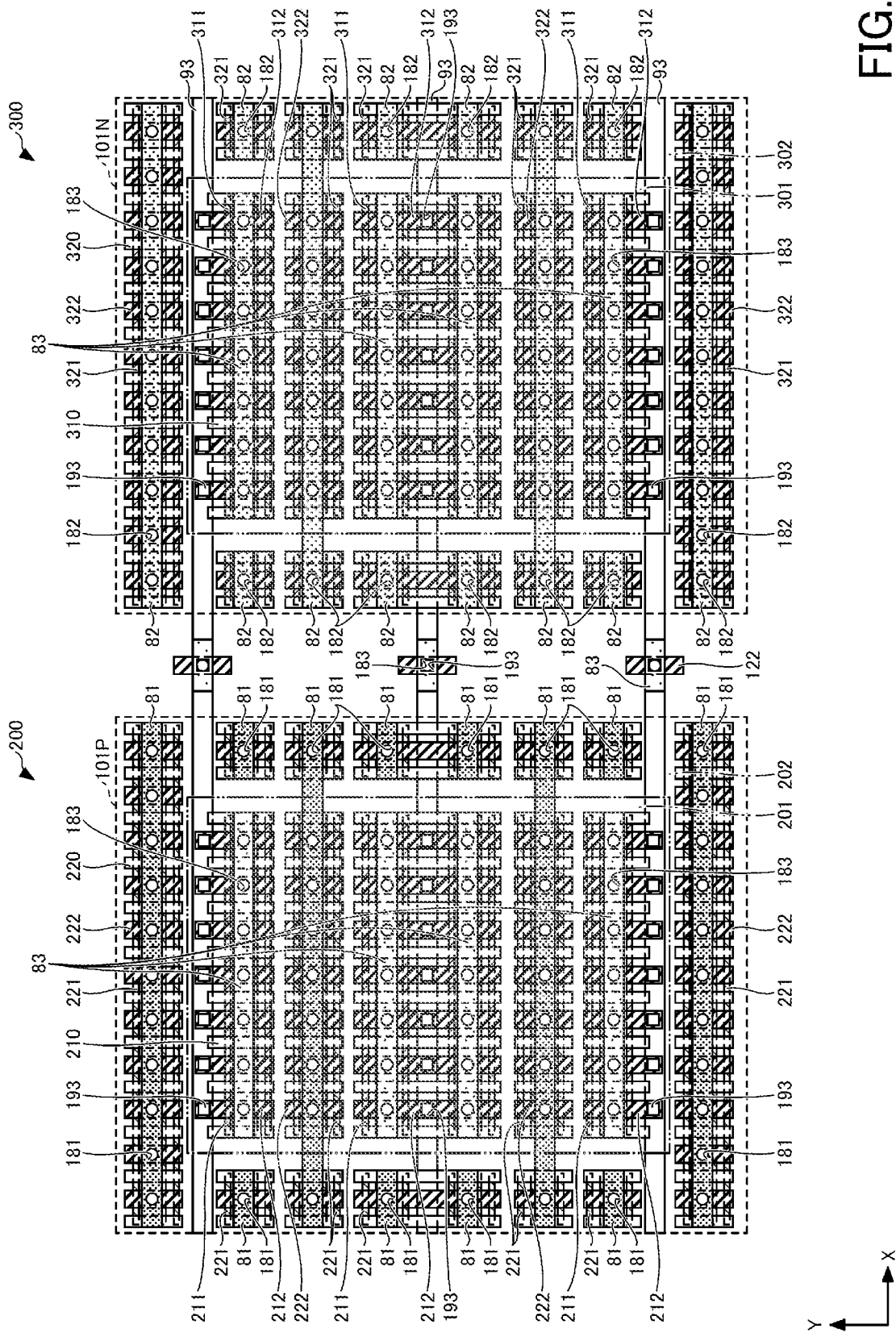
FIG. 11 is a diagram schematically depicting a planar configuration of two diodes according to a first variation of the third embodiment.

Next, a first variation of the third embodiment will be described. The first variation differs from the third embodiment in that the signal line 83 is provided in parallel with the signal line 93. FIG. 11 is a schematic diagram showing a planar configuration of the diodes 200 and 300 according to the first variation of the third embodiment.

As shown in FIG. 11, in the first variation, in the insulation film 152 (see FIG. 4) in the main portion 201 of the diode 200, a contact hole 183 reaching the local wiring 212 is formed. The signal line 83 that extends in the X-direction and is connected to the local wiring 212 through a conductor in the contact hole 183, is formed in the insulation film 153.

Moreover, in the insulation film 152 (see FIG. 4) in the main portion 301 of the diode 300, a contact hole 183 reaching the local wiring 312 is formed. The signal line 83 that extends in the X-direction and is connected to the local wiring 312 through a conductor in the contact hole 183 is formed in the insulation film 153.

Other configurations of the semiconductor device according to the first variation of the third embodiment are the same as those of the third embodiment.

According to the first variation of the third embodiment, the same effect as the third embodiment can be obtained. Additionally, in the first variation, the diode 200 is provided with the signal line 83 connected to the local wiring 212 to which the signal line 93 is connected, and the diode 300 is provided with the signal line 83 connected to the local wiring 312 to which the signal line 93 is connected. Thus, it is possible to reduce the electric resistance of the signal path through which a signal input to the I/O pad 33 propagates.

In addition, the signal line 83 in the diode 200 and the signal line 83 in the diode 300 may be connected to each other above the substrate 101.

If a portion of the power supply wiring connected to the VSS pad 31 is buried, a power supply wiring connected to a local wiring to which the buried wiring is connected may be provided above the substrate 101 to reduce the electric resistance. Similarly, if a portion of the power supply wiring connected to the VDD pad 32 is buried, a power supply wiring connected to a local wiring to which the buried wiring is connected may be provided above the substrate 101 to reduce the electric resistance.

Second Variation of the Third Embodiment

Figure 12:
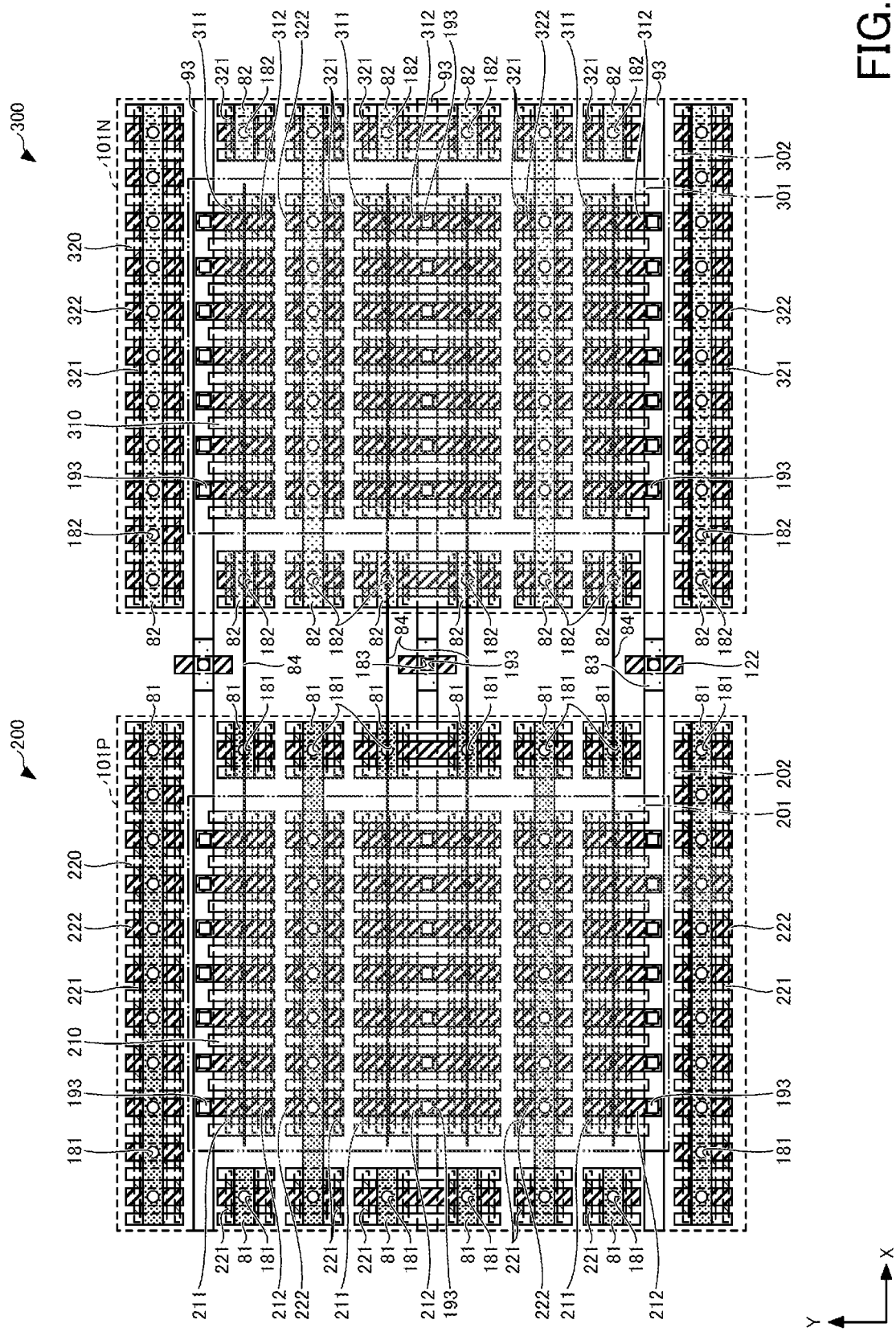
FIG. 12 is a diagram schematically depicting a planar configuration of two diodes according to a second variation of the third embodiment.

Next, a second variation of the third embodiment will be described. The second variation differs from the third embodiment mainly in that a signal line is provided in an upper layer in parallel with the signal line 93. FIG. 12 is a schematic diagram showing a planar configuration of the diodes 200 and 300 in the second variation of the third embodiment.

As shown in FIG. 12, in the second variation, four signal lines 84 are commonly provided in an upper layer of, e.g. the insulation film 153, in the diodes 200 and 300. The signal lines 84 extend, for example, in the X-direction. The signal lines 84 are connected to the local wiring 212 in the main portion 201 of the diode 200 and to the local wiring 312 in the main portion 301 of the diode 300.

Other configurations of the semiconductor device according to the second variation of the third embodiment are the same as those of the third embodiment.

According to the second variation of the third embodiment, the same effect as the third embodiment can be obtained. Additionally, in the second variation, the signal line 84 connected to the local wiring 212 to which the signal line 93 is connected in the diode 200 and connected to the local wiring 312 to which the signal line 93 is connected in the diode 300, is provided. Thus, it is possible to reduce the electric resistance of the signal path through which a signal input to the I/O pad 33 propagates.

The signal line 84 in the diode 200 and the signal line 84 in the diode 300 may be spaced apart from each other above the substrate 101. The signal line 84 may be formed in a layer different from the layer of the power supply wirings 81 and 82, or may be formed in the same layer as the power supply wirings 81 and 82 and insulated from the power supply wirings 81 and 82.

In the other embodiments and variations, a buried wiring, and a power supply wiring or a signal line provided above the substrate may be connected to the local wiring.

Third Variation of the Third Embodiment

Figure 13:
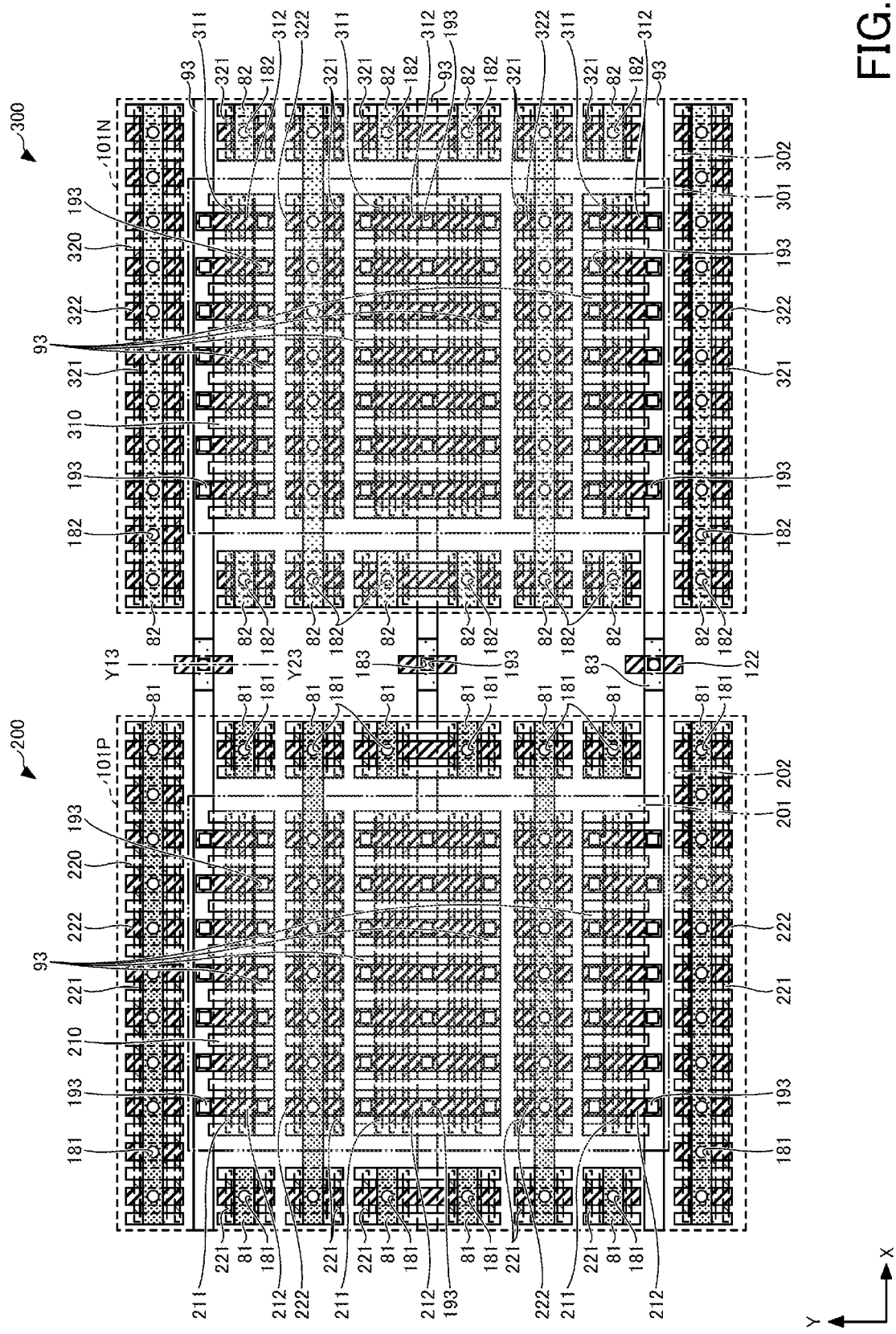
FIG. 13 is a diagram schematically depicting a planar configuration of two diodes according to a third variation of the third embodiment.

Next, a third variation of the third embodiment will be described. The third variation is different from the third embodiment mainly in the number of fins. FIG. 13 is a schematic diagram showing a planar configuration of the diodes 200 and 300 in the third variation of the third embodiment.

As shown in FIG. 13, in the third variation, the main portion 201 of the diode 200 has two sets each including two N-type fins 211, four P-type fins 221, and two N-type fins 211. A signal line 93 is formed below another end of the local wiring 212 extending in the Y-direction from the signal line 93 common between the diode 200 and the diode 300. The other end is connected to the signal line 93 through a conductor in the contact hole 193 formed in the insulation film 103 (see FIG. 4).

The main portion 301 of the diode 300 has two sets each including two P-type fins 311, four N-type fins 321, and two P-type fins 311. A signal line 93 is formed below another end of the local wiring 312 extending in the Y-direction from the signal line 93 common between the diode 200 and the diode 300. The other end is connected to the signal line 93 through a conductor in the contact hole 193 formed in the insulation film 103 (see FIG. 4).

Other configurations of the semiconductor device according to the third variation of the third embodiment are the same as those of the third embodiment.

According to the third variation of the third embodiment, the same effect as the third embodiment can be obtained. Additionally, in the third variation, the local wiring 212 is connected to the two signal lines 93 in the diode 200, and the local wiring 312 is connected to the two signal lines 93 in the diode 300. Thus, it is possible to reduce the electric resistance of the signal path through which a signal input to the I/O pad 33 propagates.

As in the third variation of the third embodiment, regarding the buried wiring, a number of fins of the same conductive type located nearest to the signal line 93 and a number of fins of different conductive type located next to the fins of the same conductive type may be different. For example, the number of fins of the same conductive type may be less than the number of fins of the different conductive type. In addition, a buried wiring may be provided on the side of the smaller number of fins.

A number of fins in the guard ring portion 202 or 302 may correspond to the number of fins in the main portion 201 or 301. For example, the number of fins in the guard ring portion 202 or 302 may be reduced so as to correspond to a part of the main portion 201 or 301 having a small number of fins. In this case, it is possible to reduce the size of the circuit, and the semiconductor device is miniaturized easily.

Fourth Variation of the Third Embodiment

Figure 14:
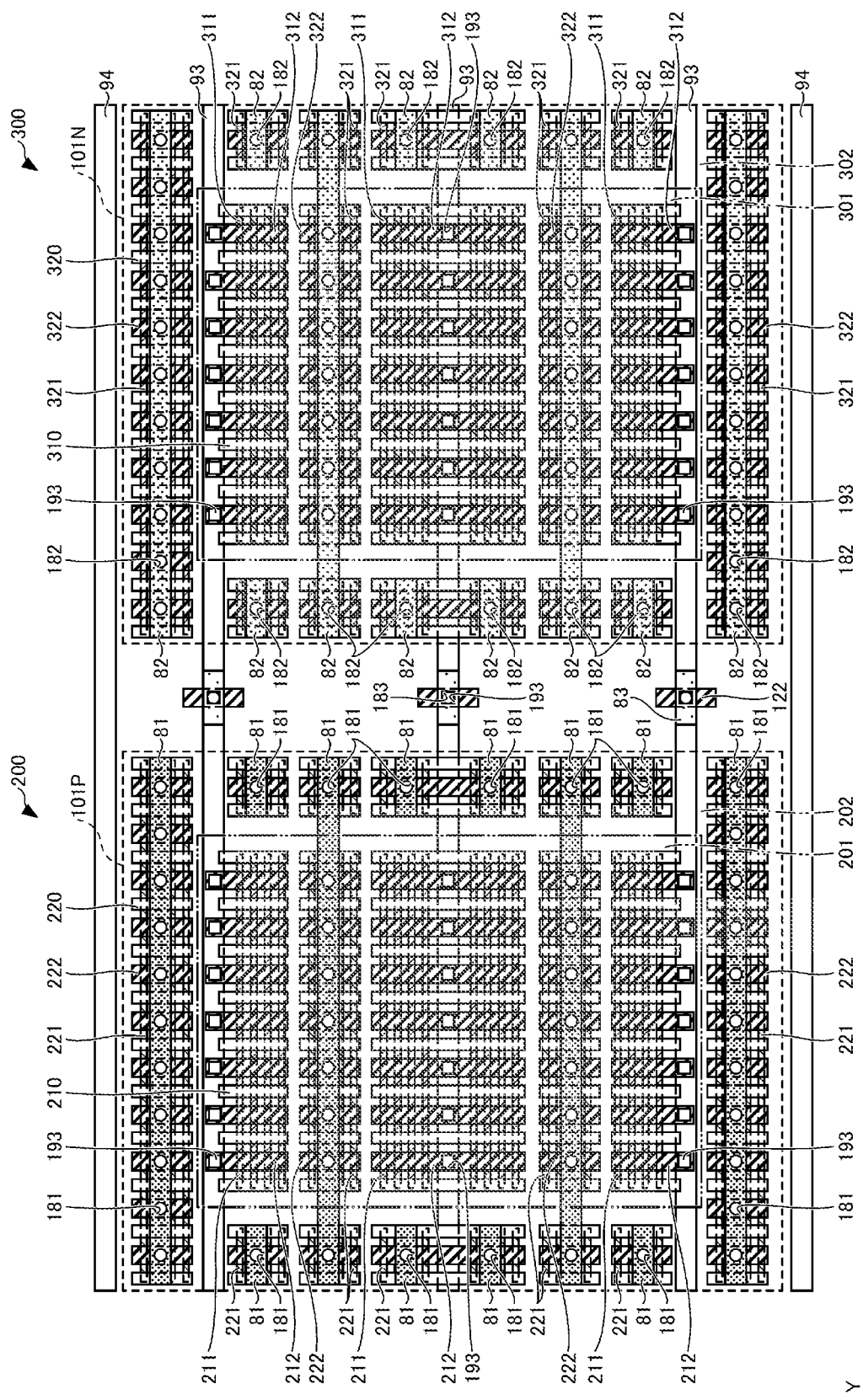
FIG. 14 is a diagram schematically depicting a planar configuration of two diodes according to a fourth variation of the third embodiment.

Next, a fourth variation of the third embodiment will be described. A fourth variation differs from the third embodiment mainly in that a dummy wiring is provided outside the guard ring portions 202 and 302. FIG. 14 is a schematic diagram showing a planar configuration of diodes 200 and 300 according to the fourth variation of the third embodiment.

As shown in FIG. 14, in the fourth variation, a groove extending in the X-direction is formed in the substrate 101 and the element separation film 102 (see FIGS. 4 and 6) outside the guard ring portions 202 and 302 in the Y-direction, and a dummy-wiring 94 is formed in the groove via the insulation film 104 (see FIGS. 4 and 6). For example, the surface of the dummy-wiring 94 is covered by an insulation film 103. For example, the surface of the element separation film 102 and the surface of the insulation film 103 may be flush with or may not be flush with the surface of the substrate 101. For example, the dummy-wiring 94 is in an electrically floating state.

Other configurations of the semiconductor device according to the fourth variation of the third embodiment are the same as those of the third embodiment.

According to the fourth variation of the third embodiment, the same effect as the third embodiment can be obtained. Additionally, in the fourth variation, dispersion in the density of the buried wirings can be reduced in the manufacturing process, to suppress an occurrence of variation in dimension.

The dummy-wiring 94 may be provided in the guard ring portion 202 and the guard ring portion 302.

In the other embodiments and variations, the dummy-wiring 94 may be provided.

Fifth Variation of the Third Embodiment

Figure 15:
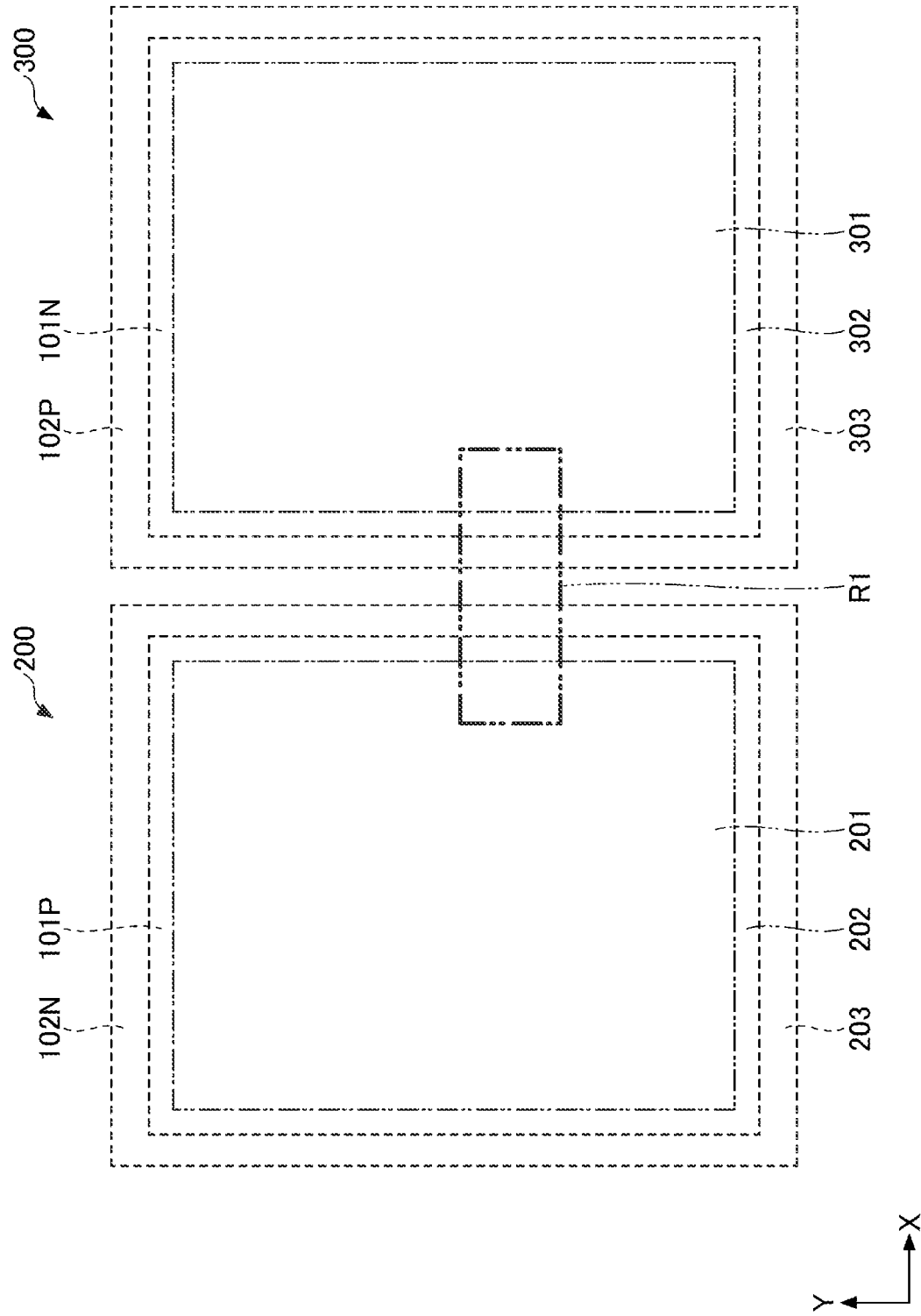
FIG. 15 is a diagram schematically depicting two diodes according to a fifth variation of the third embodiment.
Figure 16:
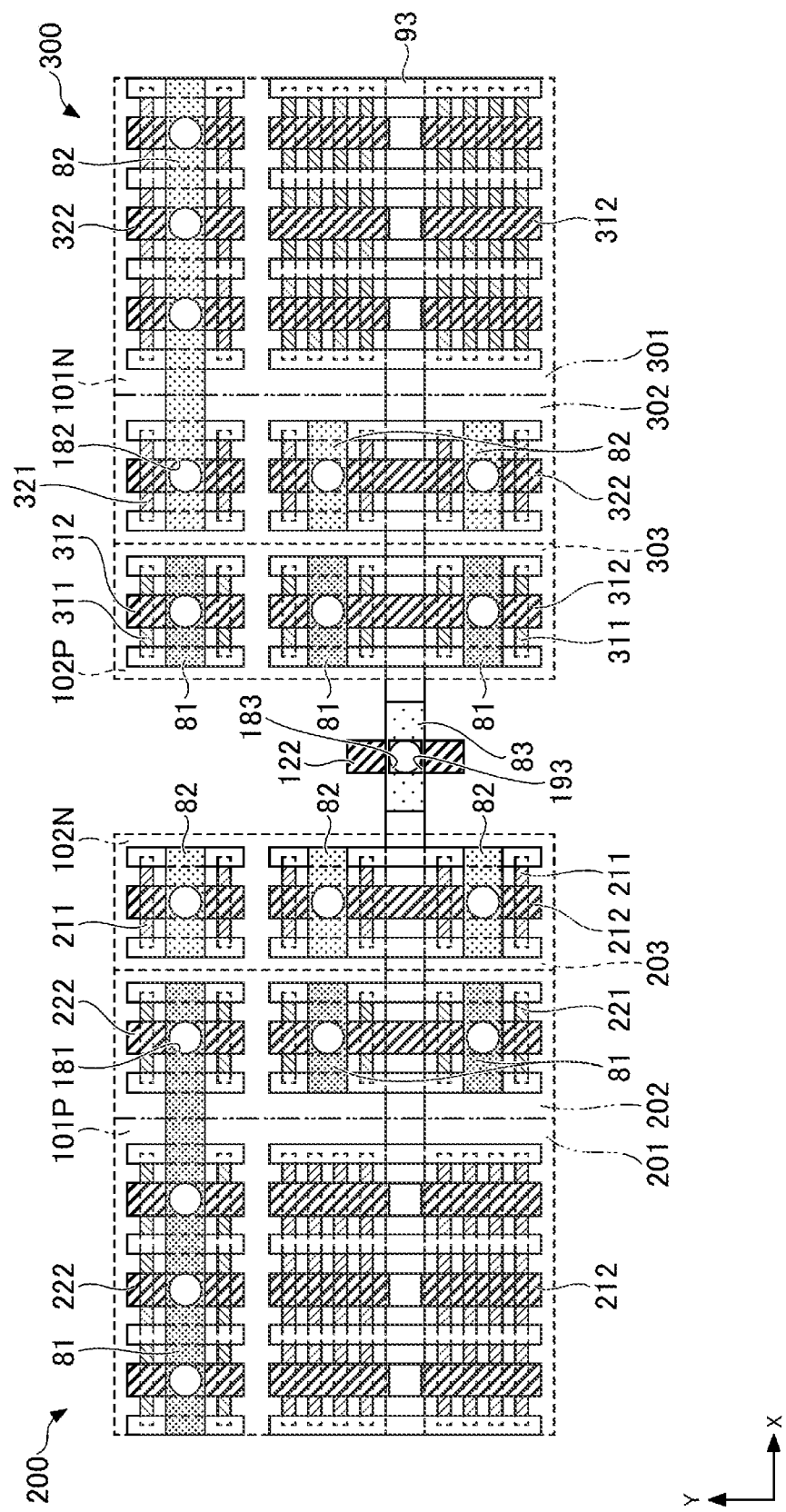
FIG. 16 is an enlarged view of a main portion of the configuration according to the fifth variation of the third embodiment.

Next, a fifth variation of the third embodiment will be described. The fifth variation differs from the third embodiment mainly in that the guard ring portions are provided in a multiple way. FIG. 15 is a schematic diagram illustrating the diodes 200 and 300 according to the fifth variation of the third embodiment. FIG. 16 is an enlarged view of a main part of the configuration according to the fifth variation of the third embodiment. FIG. 16 corresponds to a region R1, which is indicated by using dashed double-dotted lines in FIG. 15.

As shown in FIG. 15, in the fifth variation, the diode 200 includes a main portion 201 and a guard ring portion 202 provided in the P-well 101P and a guard ring portion 203 provided in the N-well 102N around the guard ring portion 202. Moreover, the diode 300 includes a main portion 301 and a guard ring portion 302 provided in the N-well 101N and a guard ring portion 303 provided in the P-well 102P around the guard ring portion 302.

As shown in FIG. 16, a plurality of N-type fins 211 are arranged annularly in the guard ring portion 203. Moreover, the guard ring portion 203 also includes the local wiring 212 connected to the N-type fin 211 and the power supply wiring 82 connected to the local wiring 212. A plurality of P-type fins 311 are arranged annularly in the guard ring portion 303. Moreover, the guard ring portion 303 includes the local wiring 312 connected to the P-type fin 311 and the power supply wiring 81 connected to the local wiring 312.

Other configurations of the semiconductor device according to the fifth variation of the third embodiment are the same as those of the third embodiment.

According to the fifth variation of the third embodiment, the same effect as the third embodiment can be obtained. Furthermore, because the guard ring portions 203 and 303 are provided, leakage of current from the main portions 201 and 301 to the outside can be reduced. Three or more guard ring portions may be formed.

The dummy-wiring 94 of the fourth variation may be provided between the guard ring portion 202 and the guard ring portion 203. The other dummy-wiring 94 may also be provided outside the guard ring portion 203. Similarly, the dummy-wiring 94 may be provided between the guard ring portion 302 and the guard ring portion 303. The other dummy-wiring 94 may be provided outside the guard ring portion 303.

In the other embodiments and variations, multiple guard ring portions may be provided, and the dummy-wiring 94 may be provided between or outside the multiple guard ring portions.

Fourth Embodiment

Figure 17:
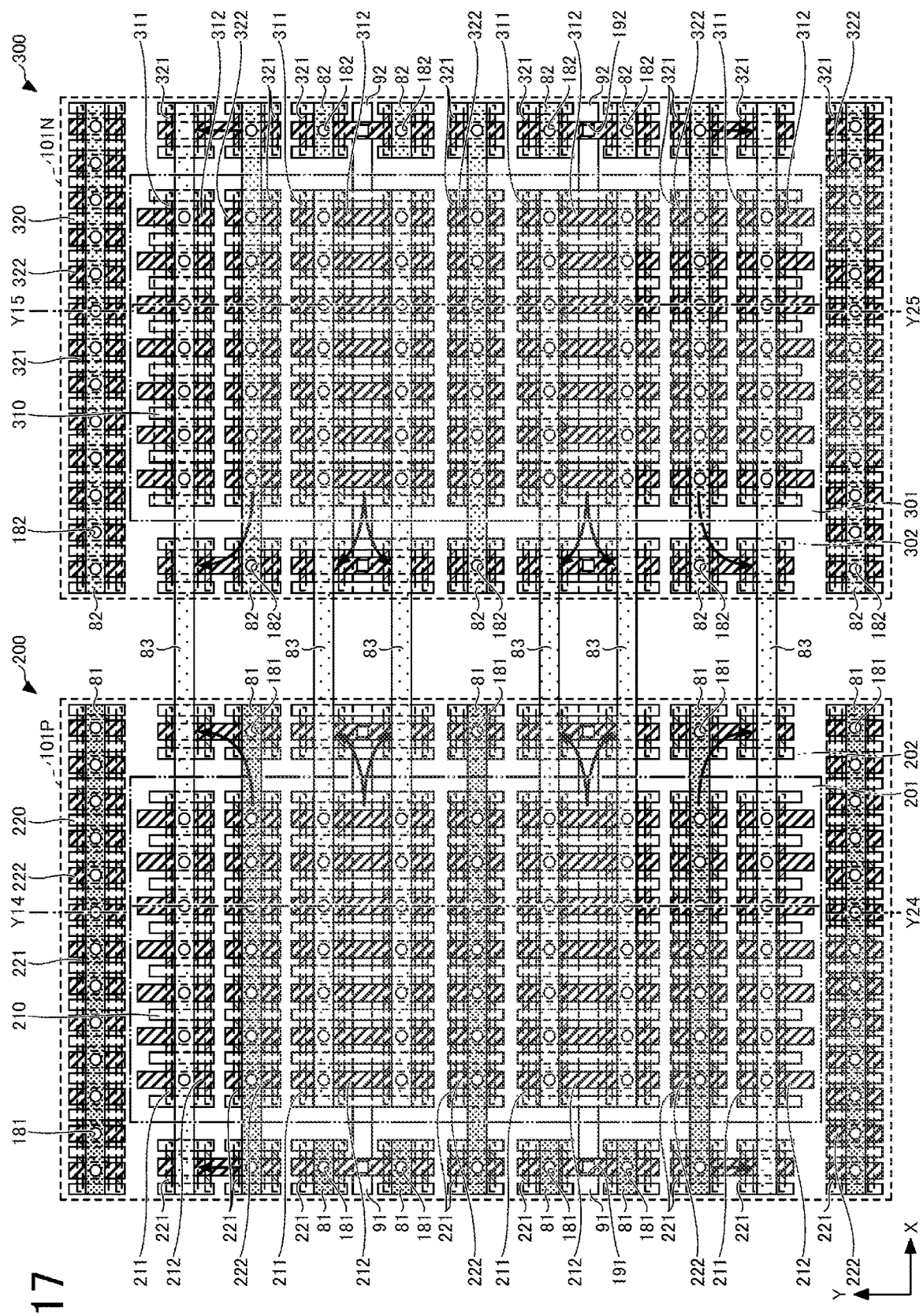
FIG. 17 is a diagram schematically depicting a planar configuration of two diodes according to a fourth embodiment.
Figure 18:
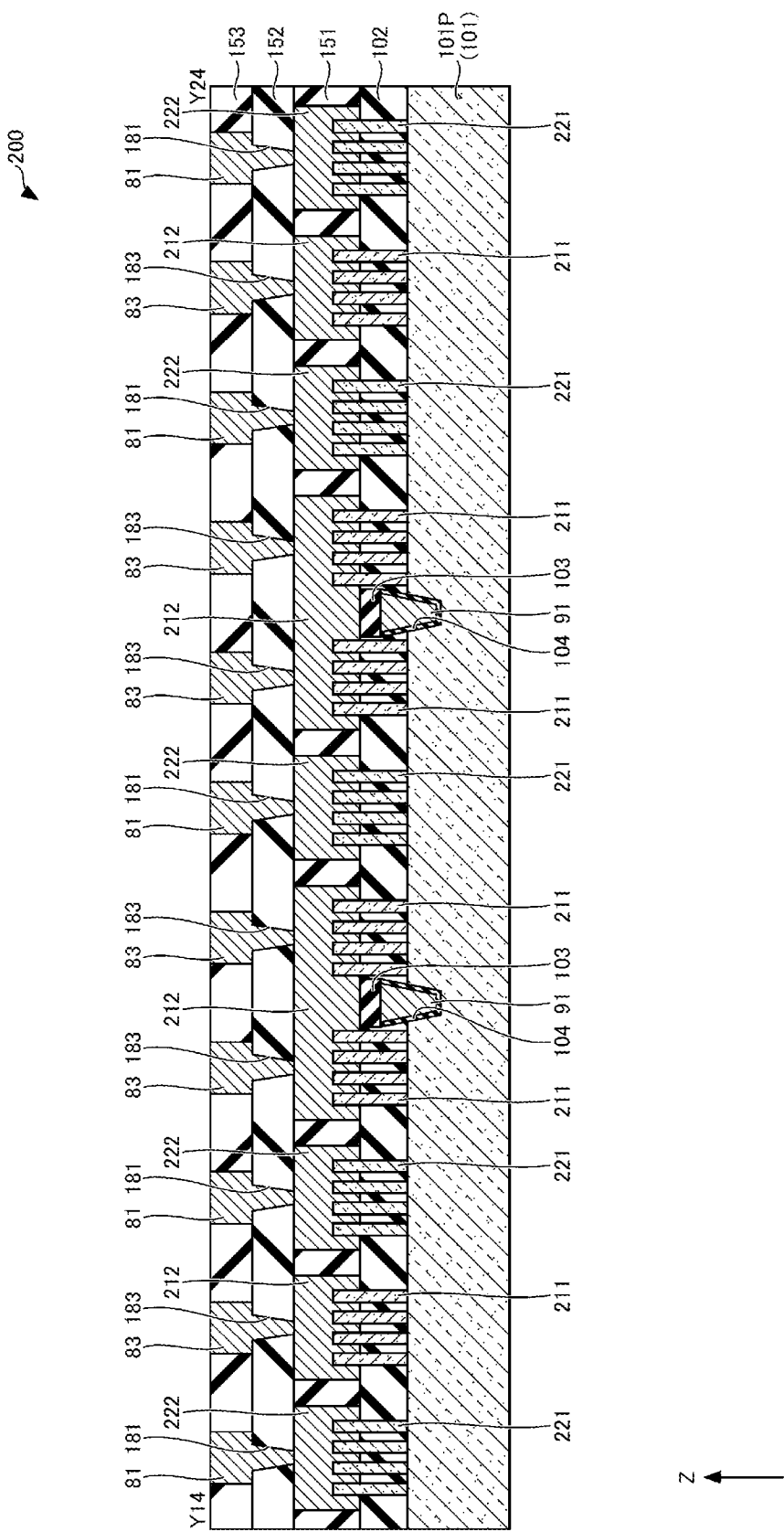
FIG. 18 is a cross-sectional view illustrating the one diode according to the fourth embodiment.
Figure 19:
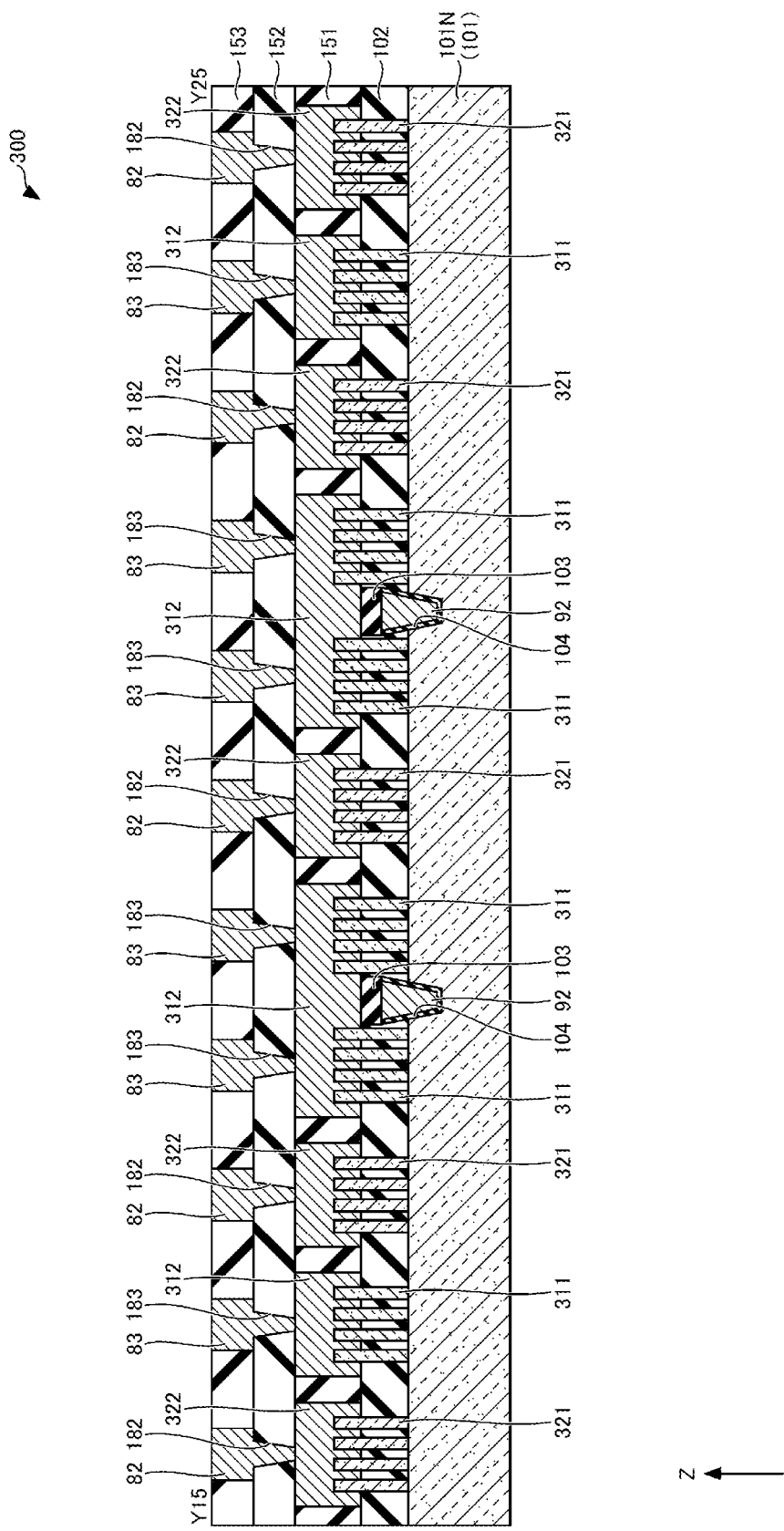
FIG. 19 is a cross-sectional view illustrating another diode according to the fourth embodiment.

Next, a fourth embodiment will be described. The fourth embodiment differs from the third embodiment mainly in that the power supply wiring is buried. FIG. 17 is a schematic diagram showing a planar configuration of the diodes 200 and 300 according to the fourth embodiment. FIG. 18 is a cross-sectional view illustrating the diode 200 according to the fourth embodiment. FIG. 19 is a cross-sectional view illustrating the diode 300 according to the fourth embodiment. FIG. 18 corresponds to a cross section cut along a line Y14-Y24 in FIG. 17. FIG. 19 corresponds to a cross section cut along a line Y15-Y25 in FIG. 17.

As shown in FIGS. 17 to 19, in the fourth embodiment, six signal lines 83 are commonly provided in the diodes 200 and 300. The signal lines 83 are connected to the local wiring 212 in the main portion 201 and the local wiring 312 in the main portion 301 through conductors in the contact holes 183.

As shown in FIGS. 17 and 18, the diode 200 is provided with the power supply wirings 81 from one side of the six signal lines 83 along the Y-direction, between the first and second signal lines 83, between the third and fourth signal lines 83, and between the fifth and sixth signal lines 83. The power supply wiring 81 is connected to the local wiring 222 through a conductor in the contact hole 181. The diode 200 is further provided with the power supply wirings 91 from one side of the six signal lines 83 along the Y-direction, between the second and third signal lines 83 and between the fourth and fifth signal lines 83. The power supply wiring 91 is formed via the insulation film 104 (see FIG. 4) in the groove formed in the P-well 101P and the element separation film 102. In the guard ring portion 202, the local wiring 222 is connected to the power supply wiring 91 through a conductor in the contact hole 191 formed in the insulation film 103.

From one side of the six signal lines 83 along the Y-direction, ends of the second to fifth signal lines 83 on the side opposite to the diode 300 are in the main portion 201, and the power supply wirings 81 are provided on extensions of the second to fifth signal lines 83 in the guard ring portion 202, respectively. The power supply wirings 81 are connected to the power supply wirings 91.

As shown in FIGS. 17 and 19, the diode 300 is provided with the power supply wirings 82 from one side of the six signal lines 83 along the Y-direction, between the first and second signal lines 83, between the third and fourth signal lines 83, and between the fifth and sixth signal lines 83. The power supply wiring 82 is connected to the local wiring 322 through a conductor in the contact hole 182. The diode 300 is further provided with the power supply wirings 92 from one side of the six signal lines 83 along the Y-direction, between the second and third signal lines 83 and between the fourth and fifth signal lines 83. The power supply wiring 92 is formed via the insulation film 104 (see FIG. 4) in the groove formed in the N-well 101N and the element separation film 102. In the guard ring portion 302, the local wiring 322 is connected to the power supply wiring 92 through a conductor in the contact hole 192 formed in the insulation film 103.

From one side of the six signal lines 83 along the Y-direction, ends of the second to fifth signal lines 83 on the side opposite to the diode 200 are in the main portion 301, and the power supply wirings 82 are provided on extensions of the second to fifth signal lines 83 in the guard wing portion 302, respectively. The power supply wirings 82 are connected to the power supply wirings 92.

In the fourth embodiment, the diode 200 includes a power supply wiring 91 as a buried wiring, and the diode 300 includes a power supply wiring 92 as a buried wiring. Thus, according to a fourth embodiment, an ESD protection circuit including buried wiring can be implemented.

Moreover, the power supply wiring 91 is formed in the P-well 101P, and provides a VSS power supply potential to both the power supply wiring 91 and the P-well 101P. Thus, a parasitic capacitance between the power supply wiring 91 and the P-well 101P can be reduced. Similarly, the power supply wirings 92 are formed in the N-well 101N, and provide a VDD power supply potential to both the power supply wiring 92 and the N-well 101N. Thus, a parasitic capacitance between the power supply wiring 92 and the N-well 101N can be reduced.

In the fourth embodiment, for example, the VSS power supply potential is supplied to the power supply wiring 81 arranged above the guard ring portion 202. As shown by an arrow in FIG. 17, it is possible to supply the VSS power supply potential to a part of the guard ring portion 202 through the power supply wiring 91. Thus, a wiring arranged above the P-type fin 221 to supply the power supply potential to the guard ring portion 202 can be reduced. Similarly, a VDD power supply potential may be supplied to a part of the guard ring portion 302 through the power supply wiring 92. Thus, a wiring arranged above the N-type fin 321 to supply the power supply potential to the guard ring portion 302 can be reduced. Therefore, the degree of freedom of the layout of the wiring layer can be improved. For example, as described in the present embodiment, the signal lines 83 can be arranged so as to be shared by the diodes 200 and 300. The above-described configurations may be applied to the other embodiments and variations.

Moreover, in a part of the guard ring portion 202, the local wiring 222 is shared between adjacent groups of four P-type fins 221. Therefore, as indicated by arrows in FIG. 17, the VSS power supply potential supplied from the power supply wiring 81 to the local wiring 222 can be applied to two groups. Accordingly, even if the P-type fin 221 overlaps with the signal line 83 in the thickness direction, the P-type fin 221 can be supplied with the VSS power supply potential. Similarly, in a part of the guard ring portion 302, the local wiring 322 is shared between adjacent groups of four N-type fins 321. Thus, as indicated by arrows in FIG. 17, the VDD power supply potential supplied from the power supply wiring 82 to the local wiring 322 can be applied to two groups. Thus, even if the N-type fins 321 overlap with the signal line 83 in the thickness direction, the N-type fins 321 can be supplied with the power supply potential for the VDD. The above-described configurations may be applied to the other embodiments and variations.

First Variation of the Fourth Embodiment

Figure 20:
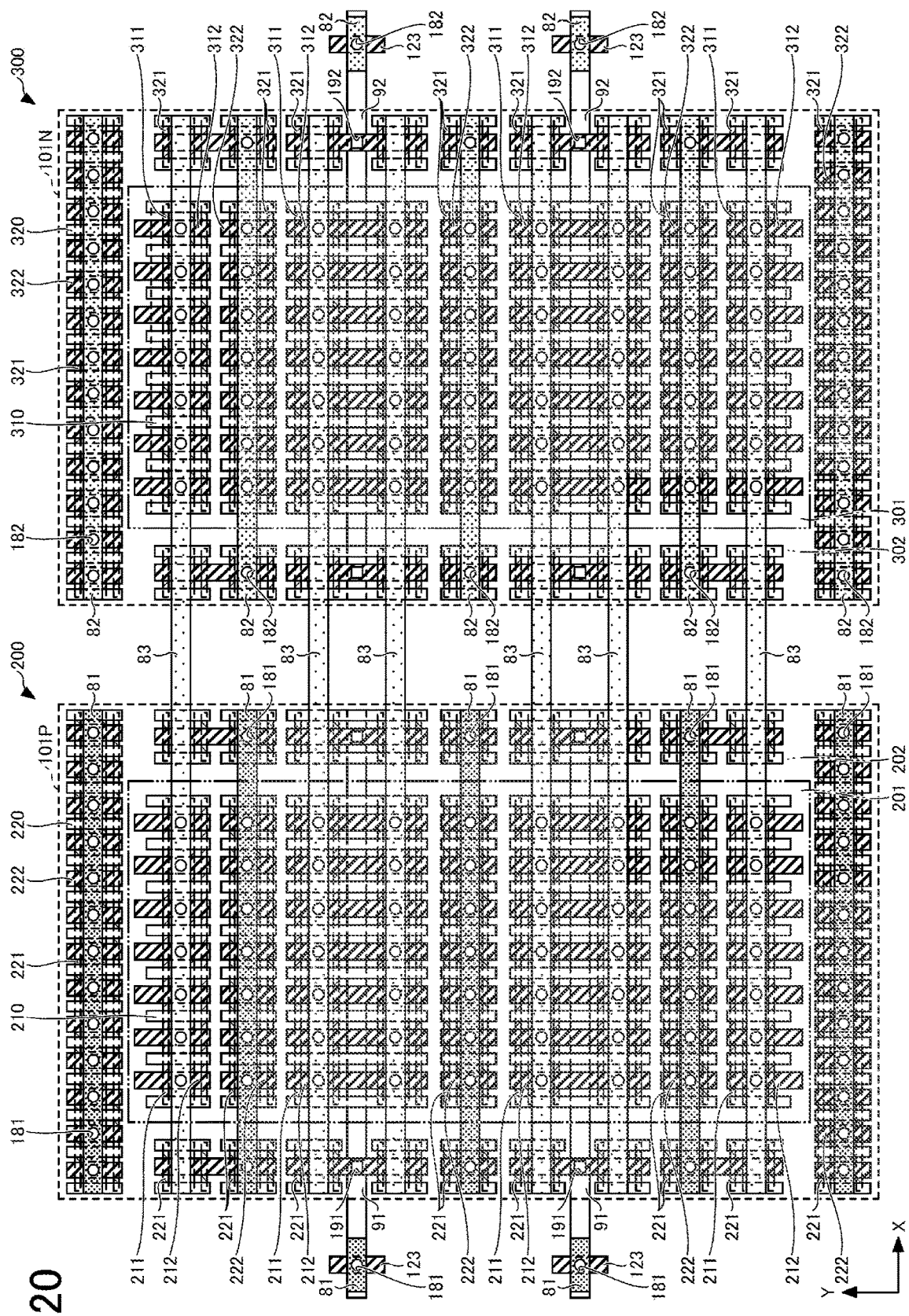
FIG. 20 is a diagram schematically depicting a planar configuration of two diodes according to a first variation of the fourth embodiment.

Next, a first variation of the fourth embodiment will be described. The first variation differs from the fourth embodiment mainly in the structure for supplying power supply potential to the power supply wiring. FIG. 20 is a schematic diagram showing a planar configuration of the diodes 200 and 300 according to the first variation of the fourth embodiment.

As shown in FIG. 20, in the first variation of the fourth embodiment, in the diode 200, from one side of the six signal lines 83 along the Y-direction, ends of the second to fifth signal lines 83 on the side opposite to the diode 300 are in the guard ring portion 202. A local wiring 123 arranged on the outside of the guard ring portion 202 is connected to the power supply wiring 91 through a conductor in the contact hole 191. Moreover, the power supply wiring 81 is connected to the local wiring 123 through a conductor in the contact hole 181.

Moreover, in the diode 300, from one side of the six signal lines 83 along the Y-direction, ends of the second to fifth signal lines 83 on the side opposite to the diode 200 are in the guard ring portion 302. A local wiring 124 arranged on the outside of the guard ring portion 302 is connected to the power supply wiring 92 through a conductor in the contact hole 192. Moreover, the power supply wiring 82 is connected to the local wiring 124 through a conductor in the contact hole 182.

Other configurations of the semiconductor device according to the first variation of the fourth embodiment are the same as those of the fourth embodiment.

In the fourth embodiment, for example, the power supply wiring 81 connected to the local wiring 123 is connected to the VSS pad 31, and a power supply wiring 82 connected to the local wiring 124 is connected to the VDD pad 32. In the same manner as the fourth embodiment, the VSS or VDD power supply potential is supplied to the main portions 201 and 301 and the guard ring portions 202 and 302.

According to the first variation of the fourth embodiment, the same effect as the fourth embodiment can be obtained.

In the other embodiments and variations, the power supply potential may be supplied from the outside of the guard ring portions 202 and 302, in the same manner as in the first variation of the fourth embodiment.

Second Variation of the Fourth Embodiment

Figure 21:
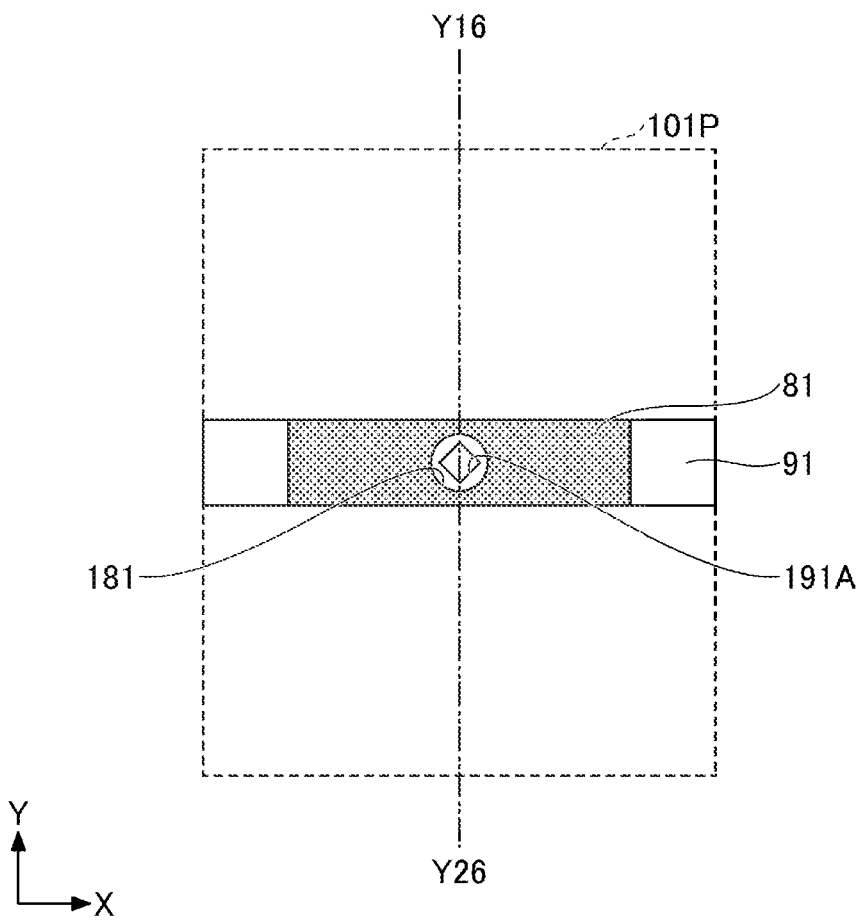
FIG. 21 is a diagram schematically depicting a supply section of a power supply potential to a power supply wiring according to a second variation of the fourth embodiment.
Figure 22:
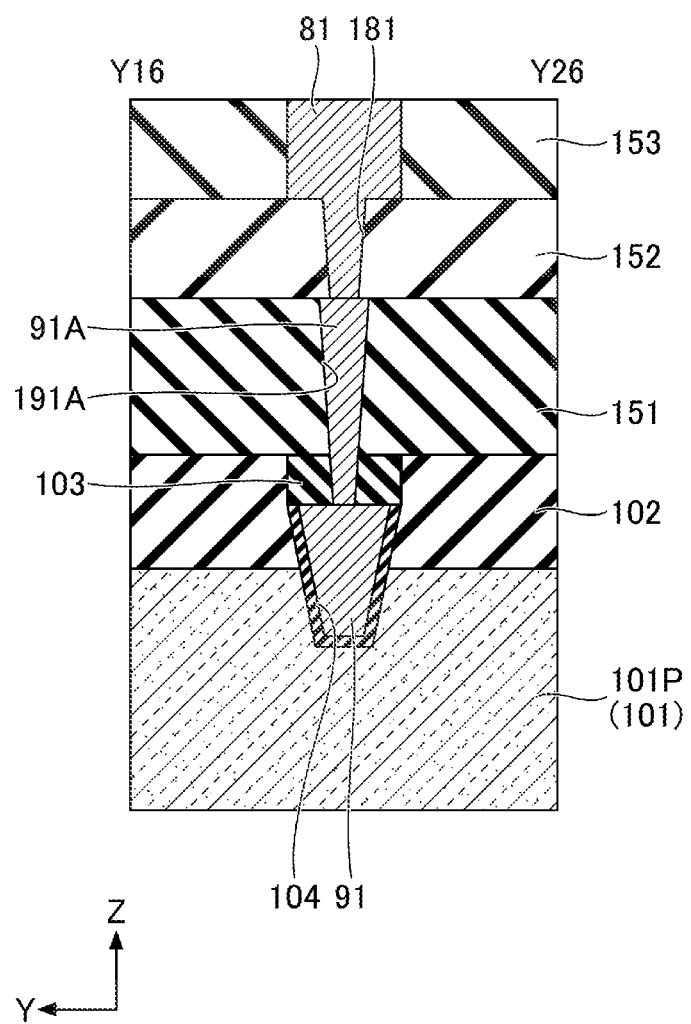
FIG. 22 is a cross-sectional view illustrating the supply section of the power supply potential to the power supply wiring according to the second variation of the fourth embodiment.

Next, a second variation of the fourth embodiment will be described. The second variation of the fourth embodiment differs from the fourth embodiment mainly in the structure for supplying a power supply potential to the power supply wiring. FIG. 21 is a schematic diagram showing a supply unit for supplying a power supply potential to the power supply wiring 91 according to the second variation of the fourth embodiment. FIG. 22 is a cross-sectional view illustrating the supply unit for supplying a power supply potential to the power supply wiring 91 according to the second variation of the fourth embodiment. FIG. 22 corresponds to a cross section cut along a line Y16-Y26 in FIG. 21.

As shown in FIGS. 21 and 22, in the second variation, a contact hole 191A reaching the power supply wiring 91 is formed in the insulation films 151 and 103, outside the guard ring portion 202 of the diode 200. A conductive plug 91A is formed in the contact hole 191A. The power supply wiring 81 is then connected to the conductive plug 91A through a conductor in the contact hole 181.

The diode 300 has the same configuration as the diode 200. That is, a contact hole reaching the power supply wiring 92 is formed in the insulation films 151 and 103, outside the guard ring portion 302 (not shown), and a conductive plug is formed in the contact hole. The power supply wiring 82 is then connected to the conductive plug through a conductor in the contact hole 182.

Other configurations of the semiconductor device according to the second variation of the fourth embodiment are the same as those of the fourth embodiment.

According to the second variation of the fourth embodiment, the same effect as the first variation of the fourth embodiment can be obtained.

Third Variation of the Fourth Embodiment

Figure 23:
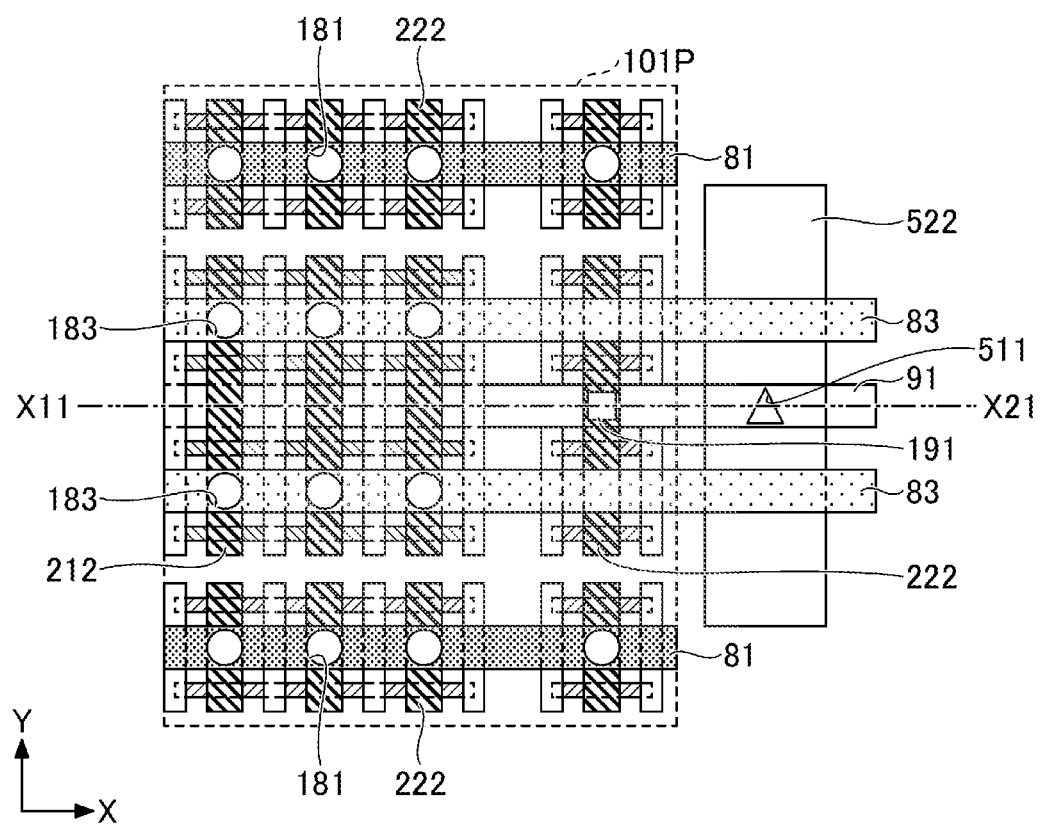
FIG. 23 is a diagram schematically depicting a supply section of a power supply potential to a power supply wiring according to a third variation of the fourth embodiment.
Figure 24:
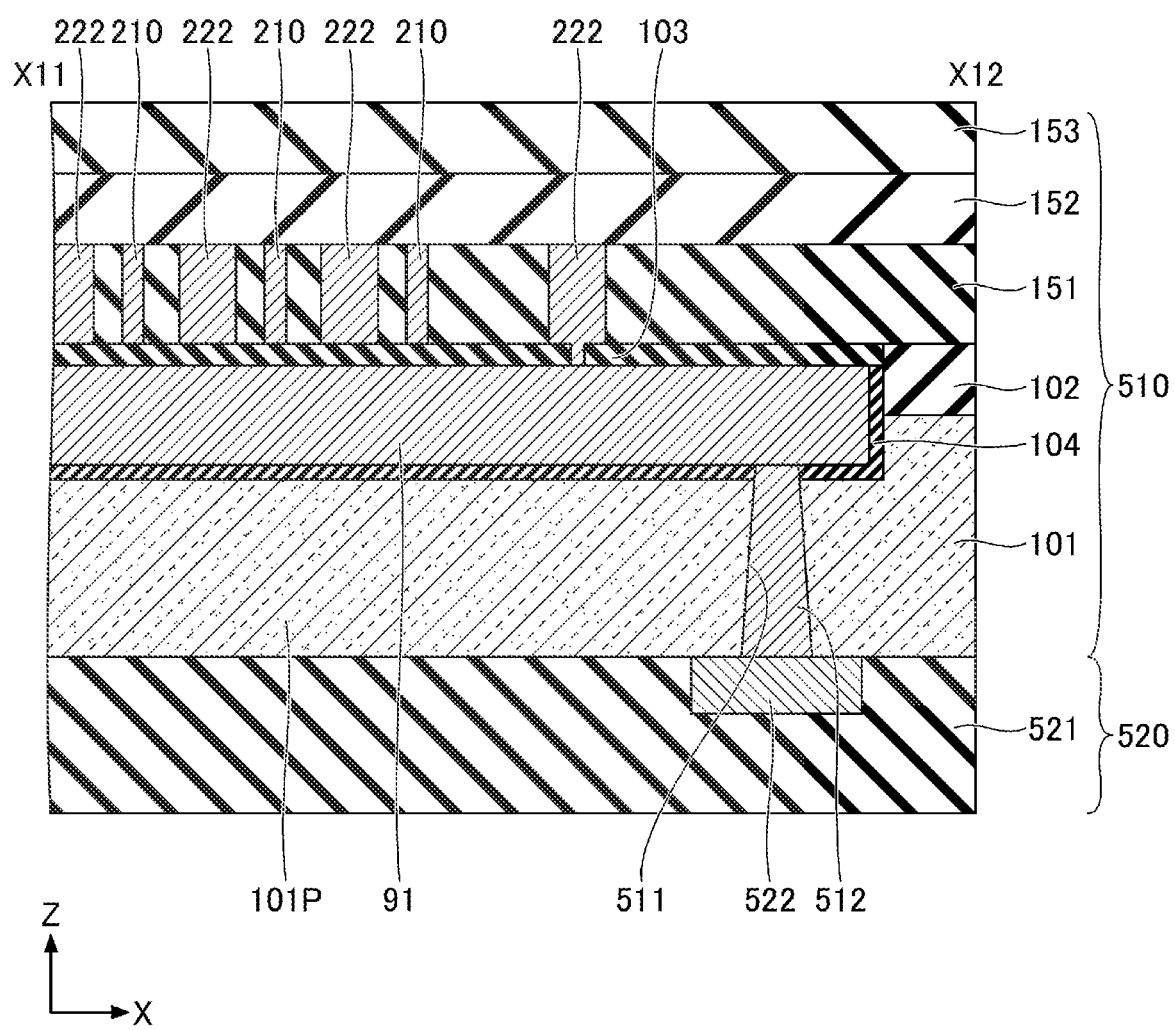
FIG. 24 is a cross-sectional view illustrating the supply section of the power supply potential to the power supply wiring according to the third variation of the fourth embodiment.

Next, a third variation of the fourth embodiment will be described. The third variation of the fourth embodiment differs from the fourth embodiment mainly in the structure for supplying the power supply potential to the power supply wiring. FIG. 23 is a schematic diagram showing a supply unit for supplying a power supply potential to the power supply wiring 91 according to the third variation of the fourth embodiment. FIG. 24 is a cross-sectional view illustrating the supply unit for supplying a power supply potential to the power supply wiring 91 according to a third variation of the fourth embodiment. FIG. 24 corresponds to a cross section cut along a line X11-X21 in FIG. 23.

As shown in FIGS. 23 and 24, the semiconductor device according to the third variation includes a first semiconductor chip 510 and a second semiconductor chip 520.

The first semiconductor chip 510 has the same configuration as that of the second variation of the fourth embodiment, except the following features. In the first semiconductor chip 510, outside the guard ring portion 202, a via hole 511 is formed in the substrate 101 from a rear surface of the substrate reaching the power supply wiring 91. A through via 512 is buried in the via hole. Moreover, outside the guard ring portion 202, the power supply wirings 91 are covered by the insulation films 103, and 151 to 153. The first semiconductor chip 510 has the same configuration as that of the second variation of the fourth embodiment, except for the above-described features.

The second semiconductor chip 520 has an insulation film 521 and a power supply wiring 522 provided on the surface of the insulation film 521. The VSS power supply potential is supplied to the power supply wiring 522. The insulation film 521 is formed, for example, above a substrate (not shown).

The diode 300 also has the above-described configuration, i.e. outside the guard ring portion 302, a via hole is formed in the substrate 101 from a rear surface of the substrate reaching the power supply wiring 92, and a through via is buried in the via hole (not shown).

Moreover, the second semiconductor chip 520 includes a power supply wiring, to which the VDD power supply potential is supplied, on a surface of the insulation film 521.

Then, the first semiconductor chip 510 and the second semiconductor chip 520 are bonded to each other so that in the diode 200 the power supply wiring 522 is connected to the through via 512, and in the diode 300 the power supply wiring, to which the VDD power supply potential is supplied, is connected to the through via.

According to the third variation of the fourth embodiment, the VSS power supply potential can be supplied to the power supply wiring 91 of the diode 200 from the power supply wiring 522 of the second semiconductor chip 520 through the through via 512. Furthermore, the VDD power supply potential can be supplied to the power supply wiring 92 of the diode 300 from the power supply wiring of the second semiconductor chip 520 through the through via.

According to the third variation of the fourth embodiment, the same effect as the fourth embodiment can be obtained. Additionally, because the power supply wiring 81 in the diode 200 and the power supply wiring 82 in the diode 300 provided in the first semiconductor chip 510 can be reduced, the degree of freedom of the layout of the wiring layer can be improved.

In the other embodiments and variations, the second semiconductor chip 520 may be used to route a power supply line or a signal line. For example, in the case where the first semiconductor chip 510 includes the signal line 93 as a buried wiring, the second semiconductor chip 520 may have a signal line on the surface of the insulation film 521.

Moreover, a connection destination of a through via, such as the through via 512, may be a wiring formed on the insulation film 153 or the like, rather than a buried wiring. For example, the through via may be connected to the power supply wiring 81 in the guard ring portion 202, or to the power supply wiring 82 in the guard ring portion 302.

Fifth Embodiment

Next, a fifth embodiment will be described. The fifth embodiment differs from the first embodiment mainly in the structure of arrangement of the fins.

Figure 25:
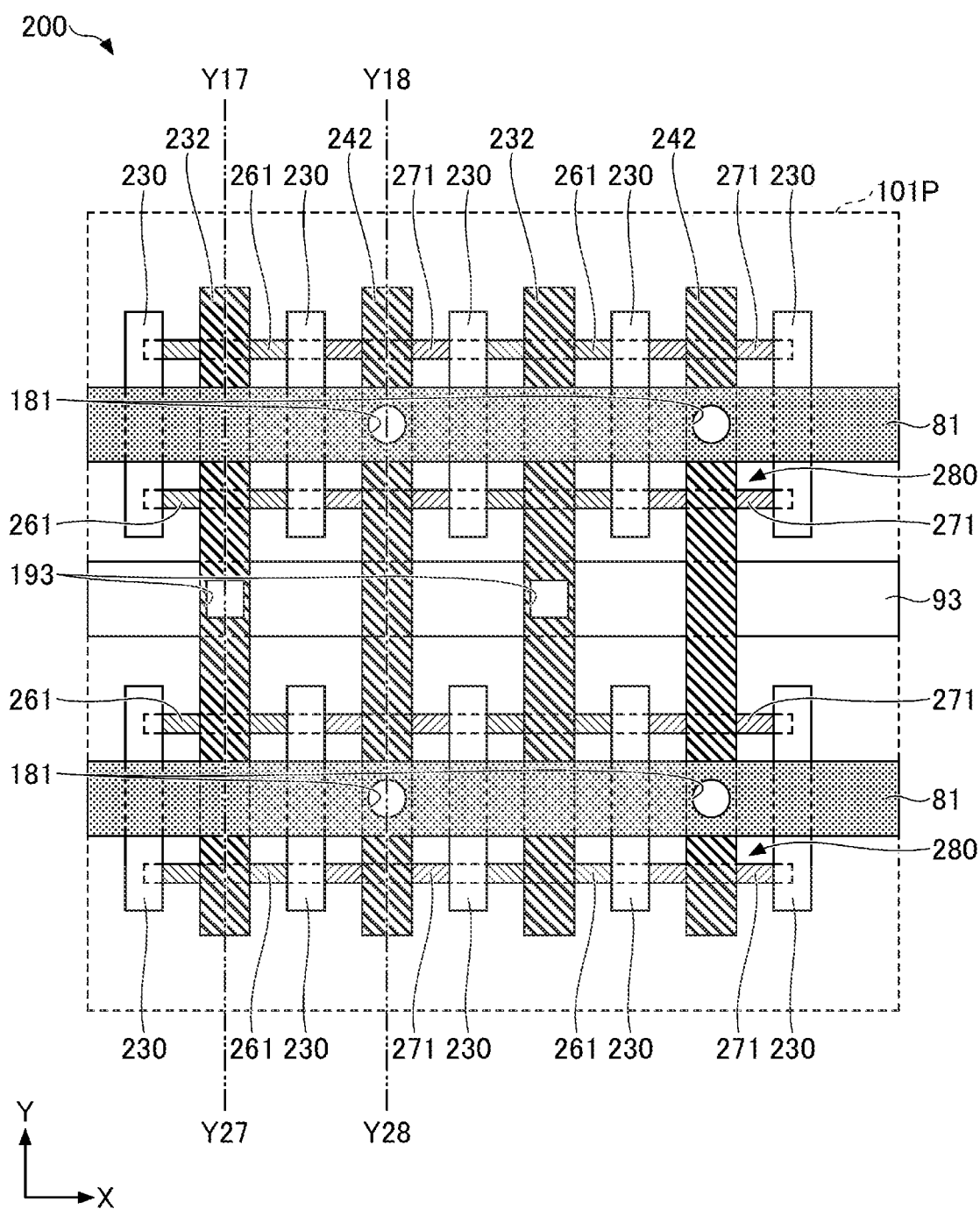
FIG. 25 is a diagram schematically depicting a planar configuration of one diode according to the fifth embodiment.
Figure 26:
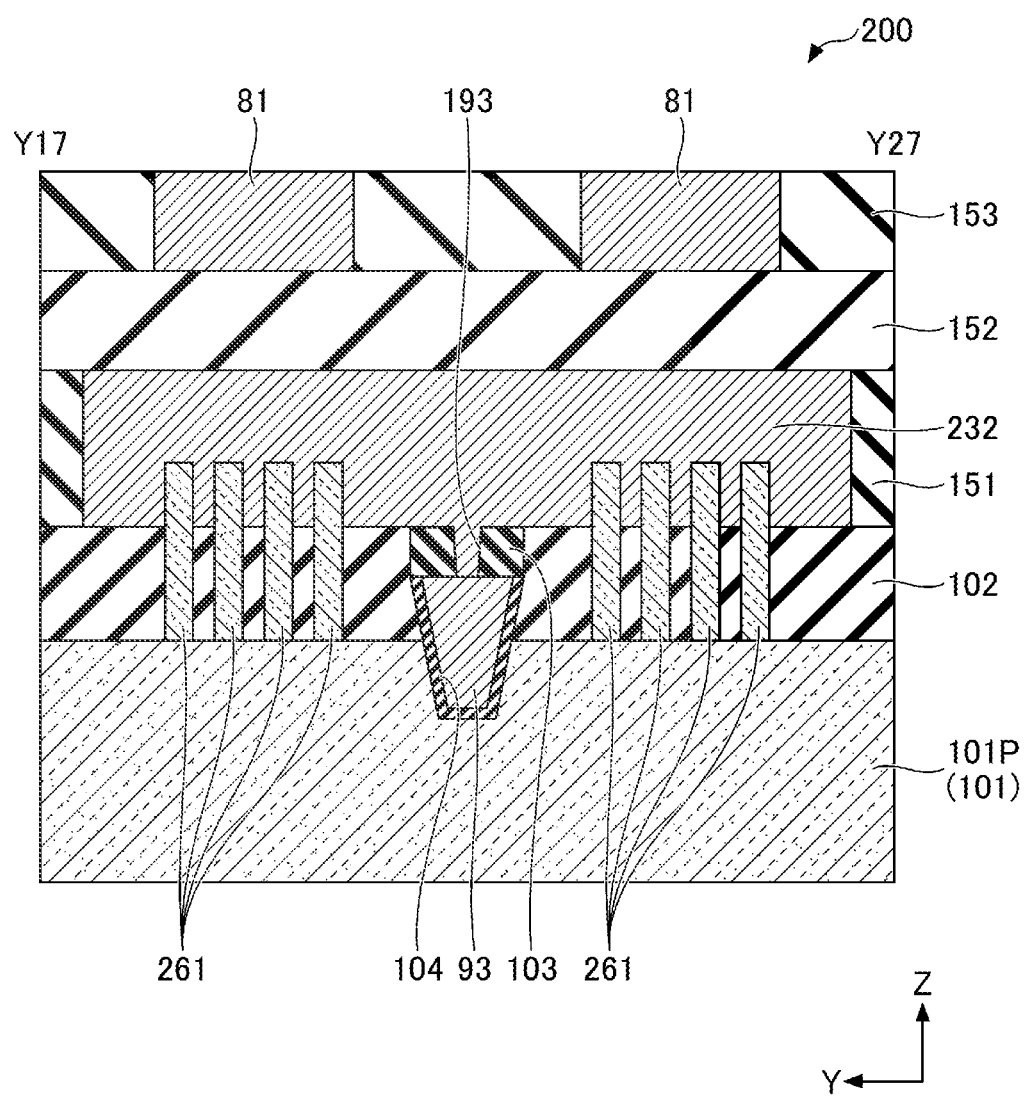
FIG. 26 is a cross-sectional view illustrating an example of the one diode according to the fifth embodiment.
Figure 27:
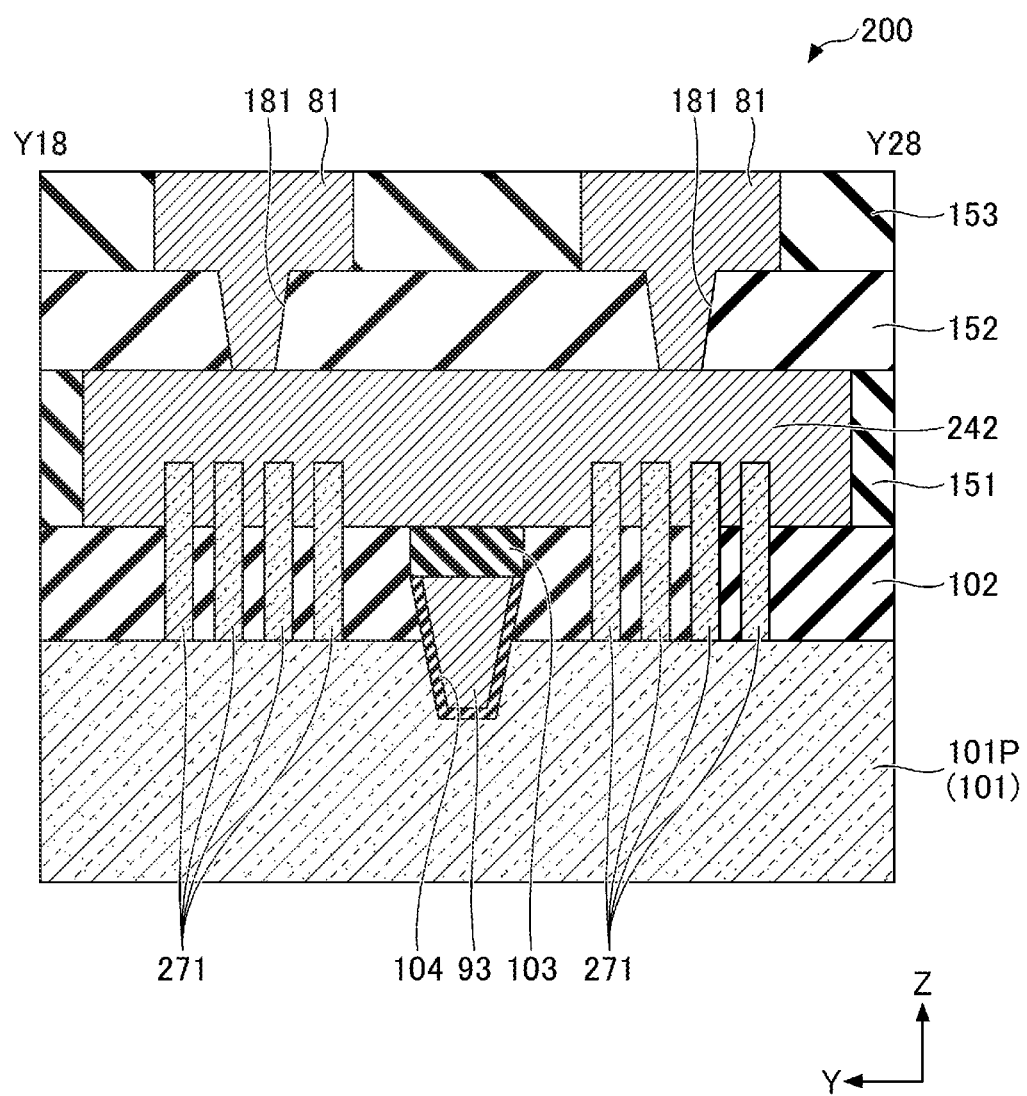
FIG. 27 is a cross-sectional view illustrating another example of the one diode according to the fifth embodiment.

First, a configuration of the diode 200 according to the fifth embodiment will be described. FIG. 25 is a schematic diagram showing the planar configuration of the diode 200 according to the fifth embodiment. FIGS. 26 and 27 are cross-sectional views showing the diode 200 according to the fifth embodiment. FIG. 26 corresponds to a cross section cut along a line Y17-Y27 in FIG. 25. FIG. 27 corresponds to a cross section cut along a line Y18-Y28 in FIG. 25.

As shown in FIGS. 25 to 27, as in the first embodiment, a signal line 93 extending in the X-direction is formed. A plurality of fins 280 extending in the X-direction and standing in the Z-direction are formed on the exposed P-well 101P from the element separation film 102 on both sides of the signal line 93 in the Y-direction. In the embodiment, four fins 280 are formed on both sides of the signal line 93, respectively. Each fin 280 includes a plurality of (in the embodiment, two) N-type regions 261 and a plurality of (in the embodiment, two) P-type regions 271, which are alternatingly arranged. The N-type regions 261 of each fin 280 are aligned in the Y-direction, and the P-type regions 271 of each fin 280 are aligned in the Y-direction.

A plurality of local wirings 232 extending in the Y-direction and connected to each N-type region 261 are formed on the element separation film 102. In the embodiment, two local wirings 232 are formed. A plurality of local wirings 242 extending in the Y-direction and connected to each P-type region 271 are formed on the element separation film 102. In the embodiment, two local wirings 242 are formed. A plurality of dummy-gate electrodes 230, such as so-called fin transistor gate electrodes, are formed so as to be arranged in the X-direction with the local wiring 232 or 242 interposed therebetween. Each of the dummy-gate electrodes 230 extends in the Y-direction. A dummy-gate insulation film (not shown) is formed between the dummy-gate electrode 230 and the fin 280.

As shown in FIGS. 25 and 26, a contact hole 193 is formed in the insulation film 103 between the local wiring 232 and the signal line 93, and the local wiring 232 is connected to the signal line 93 through a conductor in the contact hole 193.

As shown in FIGS. 25 and 27, a contact hole 181 reaching the local wiring 242 is formed in the insulation film 152. In the insulation film 153, a power supply wiring 81 which extends in the X-direction and is connected to the local wiring 242 through a conductor in the contact hole 181 is formed. For example, the power supply wiring 81 is connected to the VSS pad 31.

Figure 28:
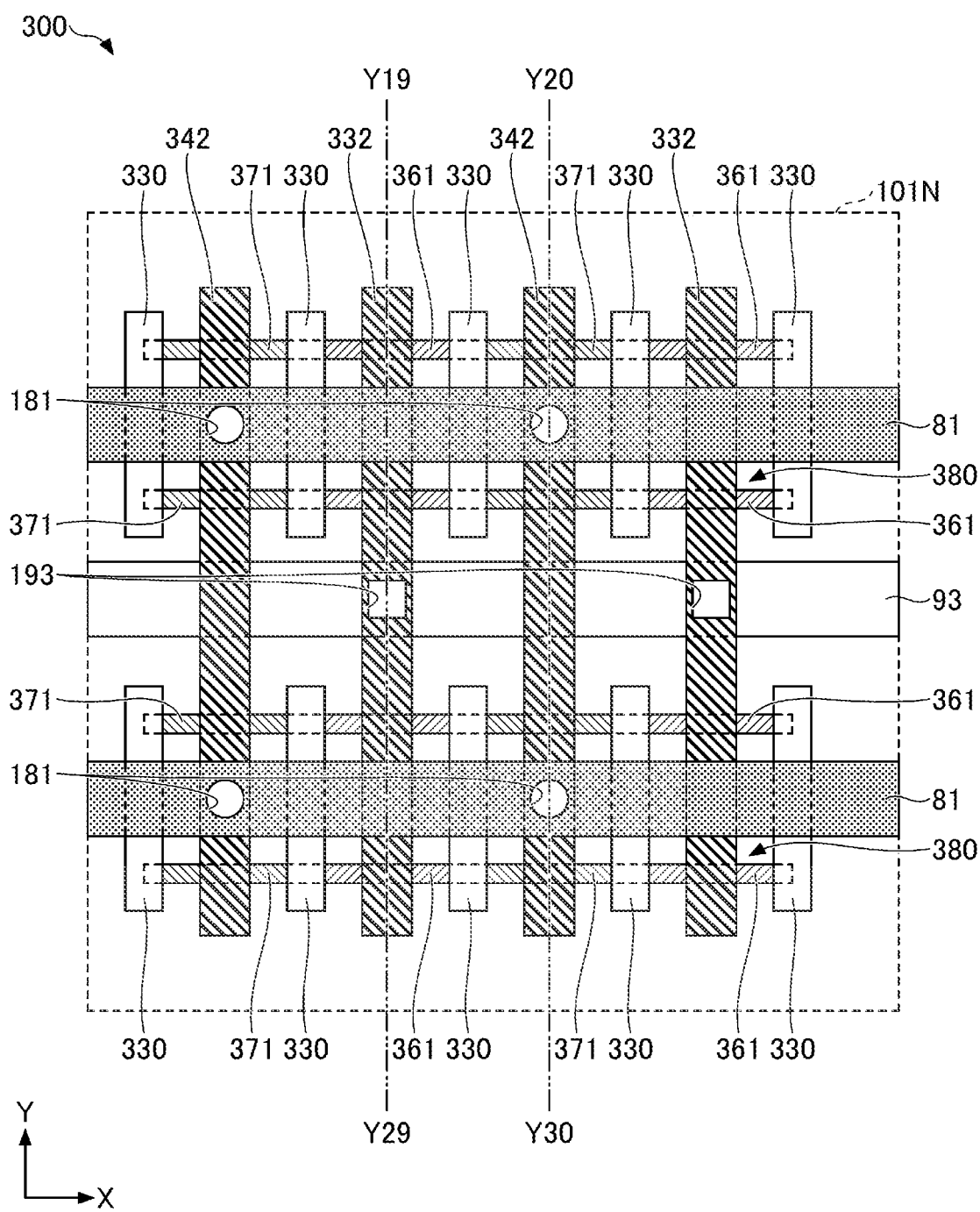
FIG. 28 is a diagram schematically depicting a planar configuration of another diode according to the fifth embodiment.
Figure 29:
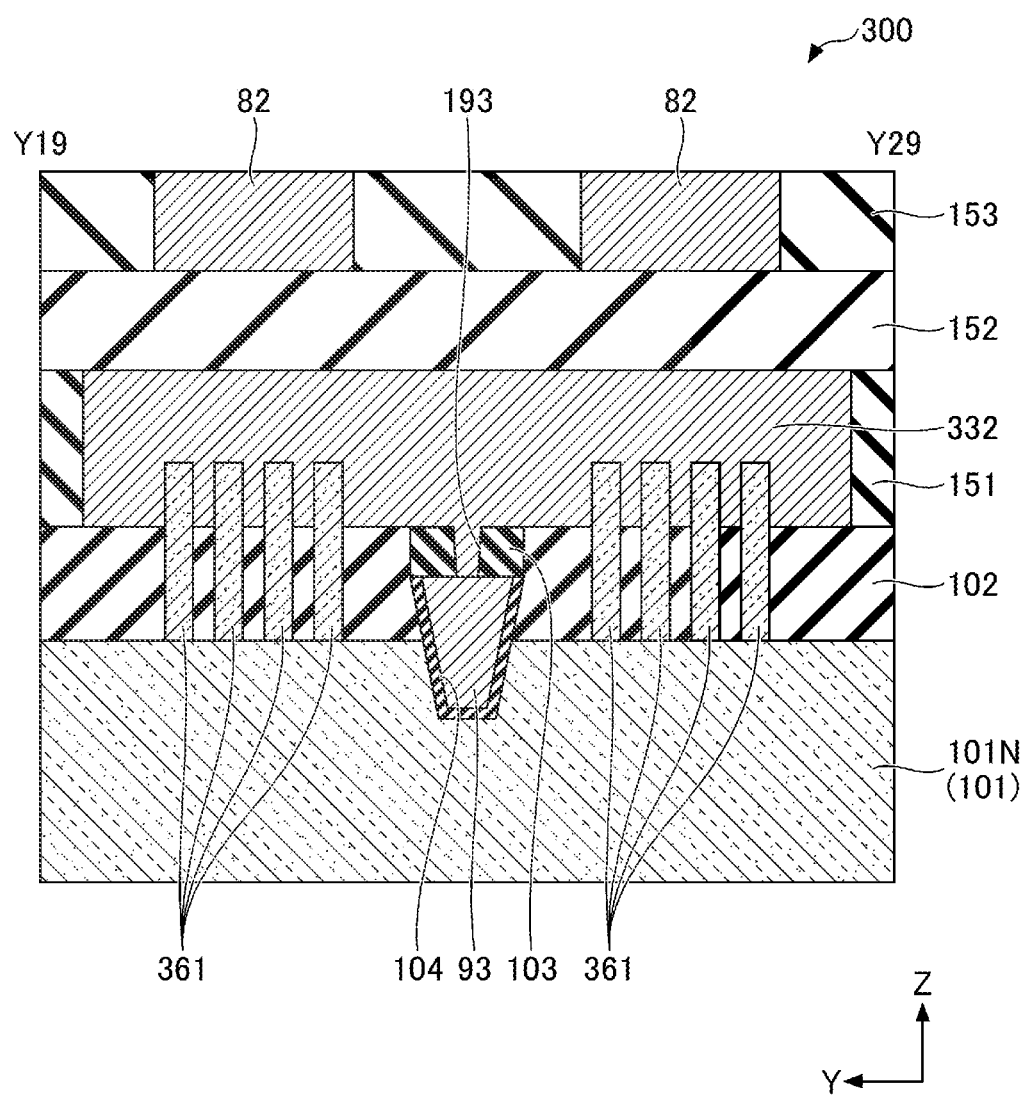
FIG. 29 is a cross-sectional view illustrating an example of the other diode according to the fifth embodiment.
Figure 30:
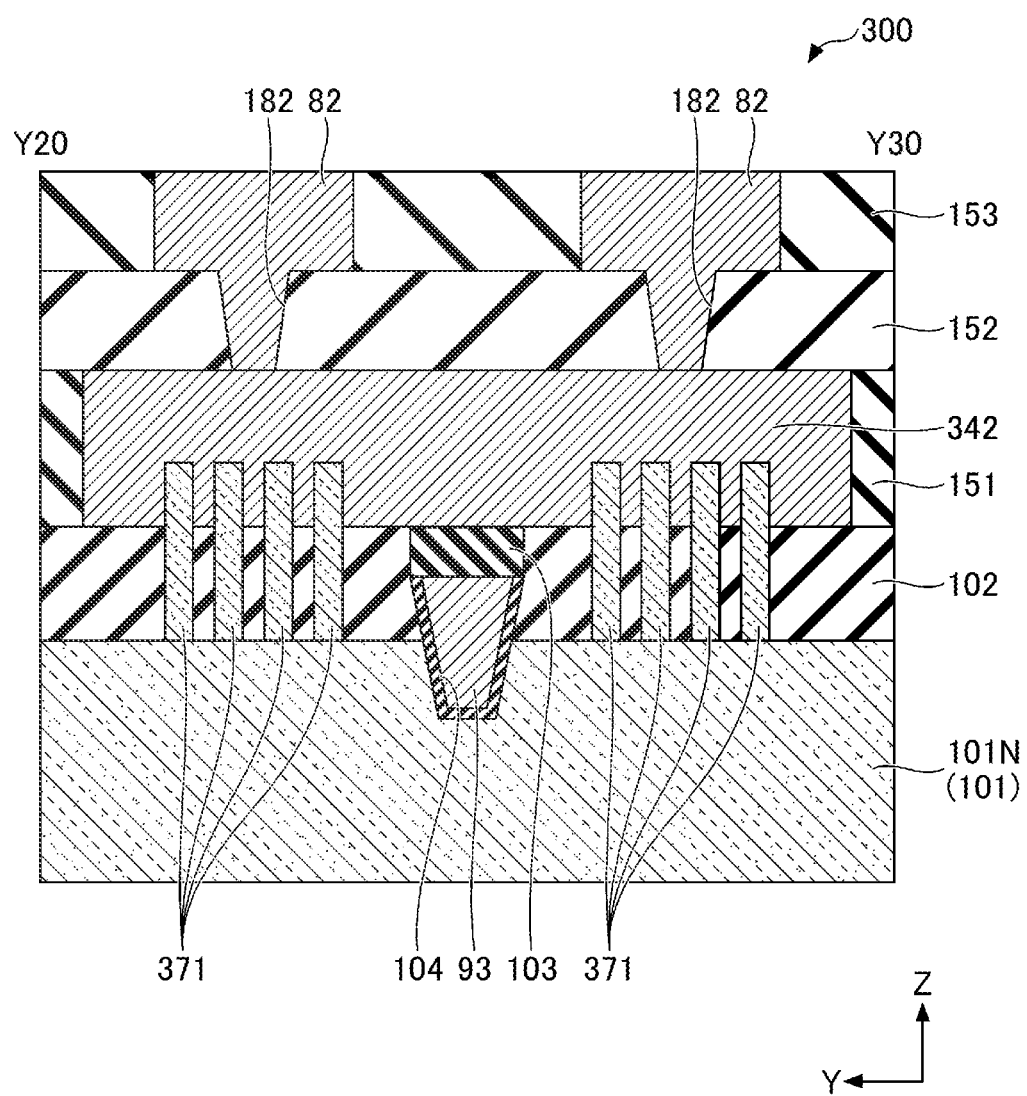
FIG. 30 is a cross-sectional view illustrating another example of the other diode according to the fifth embodiment.

Next, a configuration of the diode 300 according to the fifth embodiment will be described. FIG. 28 is a schematic diagram showing the planar configuration of the diode 300 according to the fifth embodiment. FIGS. 29 and 30 are cross-sectional views showing the diode 300 according to the fifth embodiment. FIG. 29 corresponds to a cross section cut along a line Y19-Y29 in FIG. 28. FIG. 30 corresponds to a cross section cut along a line Y20-Y30 in FIG. 28.

As shown in FIGS. 28 to 30, as in the first embodiment, a signal line 93 extending in the X-direction is formed. A plurality of fins 380, extending in the X-direction and standing in the Z-direction are formed on the exposed N-well 101N from the element separation film 102 on both sides of the signal line 93 in the Y-direction. In the embodiment, four fins 380 are formed on both sides of the signal line 93, respectively. Each fin 380 includes a plurality of (in the embodiment, two) P-type regions 361 and a plurality of (in the embodiment, two) N-type regions 371, which are alternatingly arranged. The P-type regions 361 of each fin 380 are aligned in the Y-direction, and the N-type regions 371 of each fin 380 are aligned in the Y-direction.

A plurality of local wirings 332 extending in the Y-direction and connected to each P-type region 361 are formed on the element separation film 102. In the embodiment, two local wirings 332 are formed. A plurality of local wirings 342 extending in the Y-direction and connected to each N-type region 371 are formed on the element separation film 102. In the embodiment, two local wirings 342 are formed. A plurality of dummy-gate electrodes 330, such as so-called fin transistor gate electrodes, are formed so as to be arranged in the X-direction with the local wiring 332 or 342 interposed therebetween. Each of the dummy-gate electrodes 330 extends in the Y-direction. A dummy-gate insulation film (not shown) is formed between the dummy-gate electrode 330 and the fin 380.

As shown in FIGS. 28 and 29, a contact hole 193 is formed in the insulation film 103 between the local wiring 332 and the signal line 93, and the local wiring 332 is connected to the signal line 93 through a conductor in the contact hole 193.

As shown in FIGS. 28 and 30, a contact hole 182 reaching the local wiring 342 is formed in the insulation film 152. In the insulation film 153, a power supply wiring 82 which extends in the X-direction and is connected to the local wiring 342 through a conductor in the contact hole 182 is formed. For example, the power supply wiring 82 is connected to a VDD pad 32.

In the fifth embodiment, the diode 200 includes the signal line 93 as a buried wiring and the diode 300 includes the signal line 93 as a buried wiring. Thus, according to the fifth embodiment, an ESD protection circuit including buried wirings can be implemented. Therefore, the configuration of the wirings according to the fifth embodiment is suitable for further miniaturization of semiconductor devices.

In addition, in the diode 200, instead of the power supply wiring 81, a power supply wiring connected to the local wiring 242 may be formed in the P-well 101P as a buried wiring. Similarly, in the diode 300, instead of the power supply wiring 82, a power supply wiring connected to the local wiring 342 may be formed in the N-well 101N as a buried wiring. In these cases, in the diodes 200 and 300, instead of the signal line 93, a signal line connected to the local wiring 232 and a signal line connected to the local wiring 332 may be formed in the insulation film 153.

Sixth Embodiment

Figure 31:
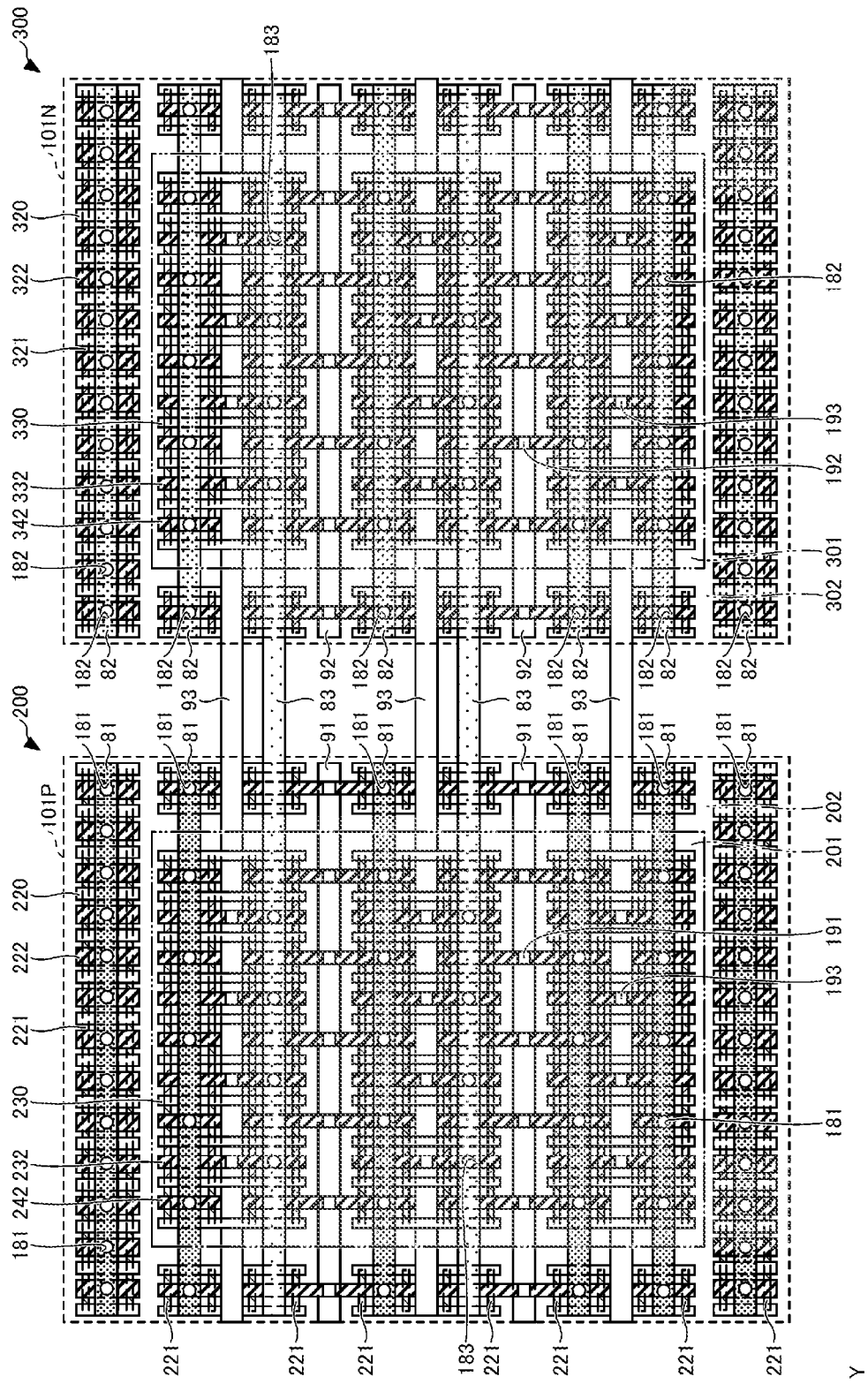
FIG. 31 is a diagram schematically depicting a planar configuration of two diodes according to a sixth embodiment.

Next, a sixth embodiment will be described. The sixth embodiment differs from the fifth embodiment mainly in a size of the diode. FIG. 31 is a schematic diagram showing a planar configuration of the diodes 200 and 300 according to the sixth embodiment.

As shown in FIG. 31, in the sixth embodiment, the diode 200 and the diode 300 are arranged in the X-direction side by side. Three signal lines 93 are provided in common for the diode 200 and the diode 300.

In the main portion 201 of the diode 200, a power supply wiring 91 extending in the X-direction is provided between two signal lines 93 adjacent in the Y-direction. A plurality of fins 280 are provided so as to interpose the signal line 93 or the power supply wiring 91 in the Y-direction. As in the fifth embodiment, each fin 280 includes a plurality of N-type regions 261 and a plurality of P-type regions 271, which are alternatingly arranged. As in the fifth embodiment, a local wiring 232 connected to the N-type region 261 and a plurality of local wirings 242 connected to the P-type region 271 are formed on the element separation film 102. The local wiring 232 is connected to the signal line 93 through a conductor in the contact hole 193. That is, the signal line 93 is connected to the N-type region 261 via the local wiring 232. The local wiring 242 is connected to the power supply wiring 91 through a conductor in the contact hole 191. That is, the power supply wiring 91 is connected to the P-type region 271 through the local wiring 242.

Additionally, the power supply wiring 81 connected to the local wiring 242 through the conductor in the contact hole 181 and the signal line 83 connected to the local wiring 232 through the conductor in the contact hole 183 are formed in the insulation film 153 (see FIGS. 26 and 27).

In the main portion 301 of the diode 300, a power supply wiring 92 extending in the X-direction is provided between two signal lines 93 adjacent in the Y-direction. A plurality of fins 380 are provided so as to interpose the signal line 93 or the power supply wiring 92 in the Y-direction. As in the fifth embodiment, each fin 380 includes a plurality of P-type regions 361 and a plurality of N-type regions 371, which are alternatingly arranged. As in the fifth embodiment, a local wiring 332 connected to the P-type region 361 and a plurality of local wirings 342 connected to the N-type region 371 are formed on the element separation film 102. The local wiring 332 is connected to the signal line 93 through a conductor in the contact hole 193. That is, the signal line 93 is connected to the P-type region 361 via the local wiring 332. The local wiring 342 is connected to the power supply wiring 91 through a conductor in the contact hole 191. That is, the power supply wiring 91 is connected to the N-type region 371 through the local wiring 342.

Additionally, the power supply wiring 82 connected to the local wiring 342 through the conductor in the contact hole 182 and the signal line 83 connected to the local wiring 332 through the conductor in the contact hole 183 are formed in the insulation film 153 (see FIGS. 26 and 27).

In the sixth embodiment, the diode 200 includes the power supply wiring 91 and the signal line 93 as buried wirings, and the diode 300 includes the power supply wiring 92 and the signal line 93 as buried wirings. Thus, according to the sixth embodiment, an ESD protection circuit including buried wirings can be implemented. Therefore, the configuration of the wirings according to the sixth embodiment is suitable for further miniaturization of semiconductor devices. In addition, according to the sixth embodiment, because buried wirings are provided, flow of electric current through the diodes 200 and 300 can be facilitated.

Furthermore, as in the fourth embodiment, the parasitic capacitance between the power supply wiring 91 and the P-well 101P can be reduced and the parasitic capacitance between the power supply wiring 92 and the N-well 101N can be reduced.

Buried wirings are not necessary to be provided at all sites between the groups each including four fins adjacent in the Y-direction. Buried wirings may be provided at a part of the sites. In the diode 200, either one of the signal line 93 and the power supply wiring 91 may be provided as a buried wiring. In the diode 300, either one of the signal line 93 and the power supply wiring 92 may be provided as a buried wiring.

Suitable materials used for the buried wiring (the power supply wiring 91, the power supply wiring 92, the signal line 93, and the dummy-wiring 94) include, for example, ruthenium (Ru), cobalt (Co) and tungsten (W). Suitable materials used for the wiring provided above the fin (the power supply wiring 81, the power supply wiring 82, the signal line 83, and the signal line 84) include, for example, copper (Cu), ruthenium (Ru), and cobalt (Co). When copper or cobalt is used, a conductive base film (barrier metal film), such as a tantalum (Ta) film or a tantalum nitride (TaN) film, is preferably formed. When ruthenium is used, the base film may not be formed.

Suitable materials used for the local wiring include, for example, copper (Cu), ruthenium (Ru), cobalt (Co) and tungsten (W). When copper, cobalt, or tungsten is used, a conductive base film (barrier metal film), such as a titanium (Ti) film or a titanium nitride (TiN) film, is preferably formed. However, when ruthenium is used, the base film may not be formed. For the material for the conductor (via) in the contact hole, for example, the same material as that for the local wiring, or the same material as that for the wiring provided above the fin can be used.

Suitable material used for the substrate includes, for example, silicon (Si). For example, the fins can be formed by patterning the substrate. Furthermore, a silicide of a high melting point metal, such as nickel (Ni) or cobalt (Co), may be used for a part contacting with the local wiring of the fin.

Suitable materials used for the dummy-gate electrode include, for example, titanium (Ti), titanium nitride (TiN), or polycrystalline silicon (polysilicon). Suitable material used for the dummy-gate insulation film includes, for example, a high dielectric material such as a hafnium oxide, an aluminum oxide, or an oxide of hafnium and aluminum.

For example, the wirings provided above the fins (the power supply wiring 81, the power supply wiring 82, the signal line 83, and the signal line 84) are formed by a dual damascene process with contact holes provided below the fins. The wirings provided above the fins may be formed by a single damascene process, separate from the contact holes provided below them.

As described above, preferred embodiments of the present invention have been described in detail. However, it should be noted that the present invention is not limited to the configurations or the like described above. In other words, embodiments can be modified and added without departing from the spirit of the present invention, and can be appropriately defined depending on its application.

What is claimed is:

1. A semiconductor device comprising:
a substrate;
a circuit region provided with a power supply wiring, a ground wiring, and a signal line; and
a first diode connected between the signal line and a first wiring,
wherein the first wiring is one of the power supply wiring and the ground wiring,
wherein the first diode includes
a first impurity region of a first conductive type, electrically connected to the signal line, and
a second impurity region of a second conductive type, different from the first conductive type, electrically connected to the first wiring, and
wherein the signal line, the first wiring, or both is formed in the substrate.

2. The semiconductor device according to claim 1 further comprising:
a second diode connected between the signal line and a second wiring,
wherein the second wiring is the other of the power supply wiring and the ground wiring,
wherein the second diode includes
a third impurity region of the second conductive type, electrically connected to the signal line, and
a fourth impurity region of the first conductive type, electrically connected to the second wiring,
wherein the signal line, the second wiring, or both is formed in the substrate.

3. The semiconductor device according to claim 2,
wherein the signal line is formed in the substrate,
wherein a portion of the signal line connected to the first impurity region and a portion of the signal line connected to the third impurity region are connected to each other.

4. The semiconductor device according to claim 2,
wherein the first wiring and the second wiring are formed in the substrate.

5. The semiconductor device according to claim 2,
wherein the first diode includes a fifth impurity region of the second conductive type, formed in the substrate,
wherein the second diode includes a sixth impurity region of the first conductive type, formed in the substrate,
wherein the first impurity region and the second impurity region are arranged separated from each other on the fifth impurity region, and
wherein the third impurity region and the fourth impurity region are arranged separated from each other on the sixth impurity region.

6. The semiconductor device according to claim 5,
wherein in a plan view, the signal line, the first wiring, or both formed in the substrate extends in a direction parallel to a direction in which the first impurity region and the second impurity region are aligned, and
wherein in a plan view, the signal line, the second wiring, or both formed in the substrate extends in a direction parallel to a direction in which the third impurity region and the fourth impurity region are aligned.

7. The semiconductor device according to claim 5,
wherein in a plan view, the signal line, the first wiring, or both formed in the substrate extends in a direction different from a direction in which the first impurity region and the second impurity region are aligned, and
wherein in a plan view, the signal line, the second wiring, or both formed in the substrate extends in a direction different from a direction in which the third impurity region and the fourth impurity region are aligned.

8. The semiconductor device according to claim 2,
wherein the first impurity region and the second impurity region are arranged adjacent to each other on the substrate, and
wherein the third impurity region and the fourth impurity region are arranged adjacent to each other on the substrate.

9. The semiconductor device according to claim 8,
wherein in a plan view, the signal line, the first wiring, or both formed in the substrate extends in a direction parallel to a direction in which the first impurity region and the second impurity region are aligned, and
wherein in a plan view, the signal line, the second wiring, or both formed in the substrate extends in a direction parallel to a direction in which the third impurity region and the fourth impurity region are aligned.

10. The semiconductor device according to claim 8,
wherein in a plan view, the signal line, the first wiring, or both formed in the substrate extends in a direction different from a direction in which the first impurity region and the second impurity region are aligned, and
wherein in a plan view, the signal line, the second wiring, or both formed in the substrate extends in a direction different from a direction in which the third impurity region and the fourth impurity region are aligned.

11. The semiconductor device according to claim 2,
wherein the first impurity region, the second impurity region, the third impurity region, and the fourth impurity region are formed in any of a plurality of fins formed on the substrate.

12. The semiconductor device according to claim 11,
wherein a number of first fins, of the plurality of fins, connected to the signal line, the first wiring, or both formed in the substrate is less than a number of second fins adjacent to the first fins, and
wherein a number of third fins, of the plurality of fins, connected to the signal line, the second wiring, or both formed in the substrate is less than a number of fourth fins adjacent to the third fins.

13. The semiconductor device according to claim 2 further comprising:
a first guard ring portion surrounding the first diode in a plan view; and
a second guard ring portion surrounding the second diode in a plan view.

14. The semiconductor device according to claim 13,
wherein a power supply potential is supplied to the first wiring formed in the substrate from above the first guard ring portion, and
wherein a power supply potential is supplied to the second wiring formed in the substrate from above the second guard ring portion.

15. The semiconductor device according to claim 13,
wherein a power supply potential is supplied to the first wiring formed in the substrate from outside the first guard ring portion in a plan view, and
wherein a power supply potential is supplied to the second wiring formed in the substrate from outside the second guard ring portion in a plan view.

16. The semiconductor device according to claim 2,
wherein a power supply potential is supplied to the first wiring formed in the substrate from a rear surface of the substrate, and wherein a power supply potential is supplied to the second wiring formed in the substrate from the rear surface of the substrate.

17. The semiconductor device according to claim 2 further comprising:
a dummy-wiring formed in the substrate, insulated from the signal line, the first wiring, or both formed in the substrate, and insulated from the signal line, the second wiring, or both formed in the substrate.

* * * * *